US010439358B2

(12) United States Patent
Miura et al.

(10) Patent No.: US 10,439,358 B2
(45) Date of Patent: Oct. 8, 2019

(54) MANUFACTURING METHOD OF LIGHT-EMITTING DEVICE

(71) Applicant: NICHIA CORPORATION, Anan-shi, Tokushima (JP)

(72) Inventors: Soichiro Miura, Tokushima (JP); Seiji Kiyota, Itano-gun (JP); Eiichiro Okahisa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 10 days.

(21) Appl. No.: 15/496,846

(22) Filed: Apr. 25, 2017

(65) Prior Publication Data

US 2017/0317467 A1 Nov. 2, 2017

(30) Foreign Application Priority Data

Apr. 28, 2016 (JP) ................................ 2016-092102
Feb. 8, 2017 (JP) ................................ 2017-021459

(51) Int. Cl.
*H01S 5/022* (2006.01)
*H01S 5/40* (2006.01)
(Continued)

(52) U.S. Cl.
CPC ...... *H01S 5/02252* (2013.01); *H01S 5/02288* (2013.01); *H01S 5/4031* (2013.01);
(Continued)

(58) Field of Classification Search
CPC ..... H01L 33/58; H01S 5/02248–02252; H01S 5/0228; H01S 5/02288; H01S 5/02296;
(Continued)

(56) References Cited

U.S. PATENT DOCUMENTS 3,816,847 A * 6/1974 Nagao ................ H01L 31/0203 174/564
4,355,323 A * 10/1982 Kock .................. G02B 6/4204 257/680

(Continued)

FOREIGN PATENT DOCUMENTS

JP S61-249011 11/1986
JP H08-288594 A 11/1996

(Continued)

*Primary Examiner* — Xinning (Tom) Niu
*Assistant Examiner* — Sean P Hagan
(74) *Attorney, Agent, or Firm* — Foley & Lardner LLP

(57) ABSTRACT

A method of manufacturing a light-emitting device includes providing a base body including a base section; fixing a plurality of semiconductor laser elements on an upper surface of the base section; and fixing an optical member to the base body, the optical member including a plurality of lens sections, and a non-lens section disposed at a periphery of the plurality of lens sections in a top view. In the step of fixing the optical member: the optical member is arranged above the base body; (i) an inclination and a height of the optical member are adjusted after interposing an adhesive between the base body and the non-lens section, or (ii) an adhesive is interposed between the base body and the non-lens section after adjusting the inclination and the height of the optical member; and subsequently, the adhesive is cured to fix the optical member to the base body.

22 Claims, 22 Drawing Sheets

LB 22 24 20 82 100 14 90 84 12 LA 50 30 70 60

(51) Int. Cl.
*H01S 5/024* (2006.01)
*H01S 5/323* (2006.01)
*H01S 5/00* (2006.01)

(52) U.S. Cl.
CPC ......... *H01S 5/0071* (2013.01); *H01S 5/02216* (2013.01); *H01S 5/02276* (2013.01); *H01S 5/02469* (2013.01); *H01S 5/32341* (2013.01); *H01S 5/4018* (2013.01)

(58) Field of Classification Search
CPC .... H01S 5/4018; H01S 5/4025; H01S 5/4031; H01S 5/405; H01S 5/4075; H01S 5/4087–423
See application file for complete search history.

(56) References Cited

U.S. PATENT DOCUMENTS

| | | | | |
|---|---|---|---|---|
| 5,631,987 | A * | 5/1997 | Lasky | G02B 6/4201 385/88 |
| 6,314,117 | B1 * | 11/2001 | Heim | H01S 5/02212 257/433 |
| 6,567,435 | B1 * | 5/2003 | Scott | G02B 6/4201 257/729 |
| 2005/0078720 | A1 * | 4/2005 | Walker, Jr. | H01S 5/02288 372/36 |
| 2007/0007182 | A1 | 1/2007 | Onishi et al. | |
| 2009/0129420 | A1 * | 5/2009 | Regaard | H01S 5/4012 372/50.12 |
| 2017/0038505 | A1 * | 2/2017 | Chern | G02B 5/1866 |

FOREIGN PATENT DOCUMENTS

| | | | |
|---|---|---|---|
| JP | H10-022566 | A | 1/1998 |
| JP | 2004-087774 | A | 3/2004 |
| JP | 2007-012682 | A | 1/2007 |
| JP | 2007-019301 | | 1/2007 |
| JP | 2007-304311 | | 11/2007 |
| JP | 2008-015036 | | 1/2008 |
| JP | 2009-170881 | A | 7/2009 |
| JP | 2010-045274 | A | 2/2010 |
| JP | 2010-103323 | A | 5/2010 |
| JP | 2012-094728 | | 5/2012 |
| JP | 2013-073079 | A | 4/2013 |
| JP | 2014-137410 | A | 7/2014 |

* cited by examiner

| | BEFORE ADJUSTMENT | AFTER ADJUSTMENT |
|---|---|---|
| LENS NUMBER | Z STAGE POSITION (μm) | Z STAGE POSITION (μm) |
| 1 | 174 | 225 |
| 5 | 185 | 228 |
| 16 | 165 | 227 |
| 20 | 162 | 222 |

FIG.12

| | BEFORE ADJUSTMENT | AFTER ADJUSTMENT |
|---|---|---|
| ANGLE | INCLINATION TO BE ADJUSTED (°) | INCLINATION TO BE ADJUSTED (°) |
| A | −0.045 | −0.012 |
| B | 0.012 | 0.020 |
| C | −0.029 | 0.006 |
| D | −0.073 | −0.019 |
| AVERAGE OF A AND B | −0.039 | −0.002 |
| AVERAGE OF C AND D | −0.066 | −0.004 |

FIG.13

| | BEFORE ADJUSTMENT OF PLANAR POSITION | | | AFTER ADJUSTMENT OF PLANAR POSITION | | |
|---|---|---|---|---|---|---|
| LENS NUMBER | θx[°] | θy[°] | D[°] | θx[°] | θy[°] | D[°] |
| 1 | 0.020 | −0.075 | 0.078 | 0.048 | 0.032 | 0.058 |
| 2 | −0.026 | −0.153 | 0.155 | −0.045 | −0.040 | 0.060 |
| 3 | −0.081 | −0.051 | 0.096 | −0.040 | 0.064 | 0.075 |
| 4 | 0.041 | −0.024 | 0.047 | 0.015 | 0.100 | 0.101 |
| 5 | 0.018 | −0.033 | 0.037 | −0.012 | 0.097 | 0.098 |
| 6 | 0.058 | −0.150 | 0.161 | 0.042 | −0.040 | 0.058 |
| 7 | 0.068 | −0.113 | 0.132 | 0.070 | 0.005 | 0.070 |
| 8 | 0.075 | −0.105 | 0.130 | 0.047 | 0.014 | 0.049 |
| 9 | 0.092 | −0.096 | 0.133 | 0.114 | 0.023 | 0.116 |
| 10 | 0.041 | −0.097 | 0.105 | 0.005 | 0.032 | 0.032 |
| 11 | 0.111 | −0.125 | 0.168 | 0.025 | −0.012 | 0.027 |
| 12 | 0.139 | −0.122 | 0.185 | 0.059 | −0.001 | 0.059 |
| 13 | 0.099 | −0.116 | 0.153 | 0.082 | 0.003 | 0.082 |
| 14 | 0.041 | −0.118 | 0.124 | −0.091 | 0.012 | 0.092 |
| 15 | 0.071 | −0.113 | 0.133 | −0.099 | 0.024 | 0.101 |
| 16 | 0.135 | −0.111 | 0.175 | 0.213 | −0.004 | 0.213 |
| 17 | 0.122 | −0.108 | 0.163 | 0.145 | 0.004 | 0.145 |
| 18 | 0.097 | −0.140 | 0.170 | 0.067 | −0.018 | 0.070 |
| 19 | 0.098 | −0.142 | 0.173 | 0.058 | −0.015 | 0.059 |
| 20 | −0.066 | −0.107 | 0.126 | −0.010 | 0.019 | 0.021 |

MANUFACTURING METHOD OF LIGHT-EMITTING DEVICE

CROSS-REFERENCE TO RELATED APPLICATIONS

The present application claims priority to Japanese Patent Application No. 2016-092102, filed on Apr. 28, 2016, and Japanese Patent Application No. 2017-021459, filed on Feb. 8, 2017, the disclosures of which are hereby incorporated by reference in their entireties.

BACKGROUND

The present disclosure relates to a manufacturing method of a light-emitting device.

A light source device including an excitation light source such as a laser light-emitting element and a lens array of collimator lenses that collects light from the excitation light source has been proposed (see Japanese Patent Publication No. 2013-73079). In Japanese Patent Publication No. 2013-73079, a lens array holder including the lens array is screwed to a light source holding body to which the excitation light source is fixed. In addition, the lens array has a plurality of lens sections.

However, optical members such as lens arrays involve dimensional variance to some extent due to dimensional tolerance. Therefore, according to the light source device described above, a divergence angle of light emitted from each lens section may vary significantly within a single light source device. In addition, when mass-producing the light source device, a divergence angle of light of the light source device as a whole may vary significantly among the mass-produced light source devices.

SUMMARY

An object of the present disclosure is to be solved by, for example, certain embodiments described below.

According to one embodiment, a method of manufacturing a light-emitting device includes: providing a base body including a base section; fixing a plurality of semiconductor laser elements on an upper surface of the base section; and fixing an optical member to the base body, the optical member including a plurality of lens sections and a non-lens section disposed at a periphery of the plurality of lens sections in a top view, wherein, in the step of fixing the optical member: the optical member is arranged above the base body; an inclination and a height of the optical member are adjusted after interposing an adhesive between the base body and the non-lens section or an adhesive is interposed between the base body and the non-lens section after adjusting the inclination and the height of the optical member; and subsequently, the adhesive is cured to fix the optical member to the base body.

According to another embodiment, a method of manufacturing a light-emitting device includes: providing a light source unit including a base body having a base section and a wall section surrounding a first region of an upper surface of the base section, a plurality of semiconductor laser elements fixed on the upper surface of the base section inside the wall section, and a lid body that includes one or more light-transmissive sections for transmitting light emitted from at least one of the semiconductor laser elements and that is fixed on an upper surface of the wall section; and fixing an optical member to the light source unit, the optical member including a plurality of lens sections, and a non-lens section disposed at a periphery of the plurality of lens sections in a top view, wherein, in the step of fixing the optical member: the optical member is arranged above the base body; an inclination and a height of the optical member are adjusted after interposing an adhesive between the upper surface of the wall section and the non-lens section or an adhesive is interposed between the upper surface of the wall section and the non-lens section after adjusting the inclination and the height of the optical member; and subsequently, the adhesive is cured to fix the optical member to the light source unit.

According to the manufacturing method described above, a variance in a divergence angle of light emitted from each lens section in a single light-emitting device can be reduced. In addition, when mass-producing the light-emitting device, a variance in a divergence angle of light among the mass-produced light-emitting devices can be reduced.

BRIEF DESCRIPTION OF THE DRAWINGS

FIG. 12 is a table showing positions of a Z stage when light emitted from lens number 1 and other lens numbers are collimated in a practical example.

FIG. 13 is a table showing amounts of adjustment of an inclination of an optical member necessary in order to collimate light emitted from lens number 1 and other lens numbers in a practical example.

DETAILED DESCRIPTION

Figure 5A:
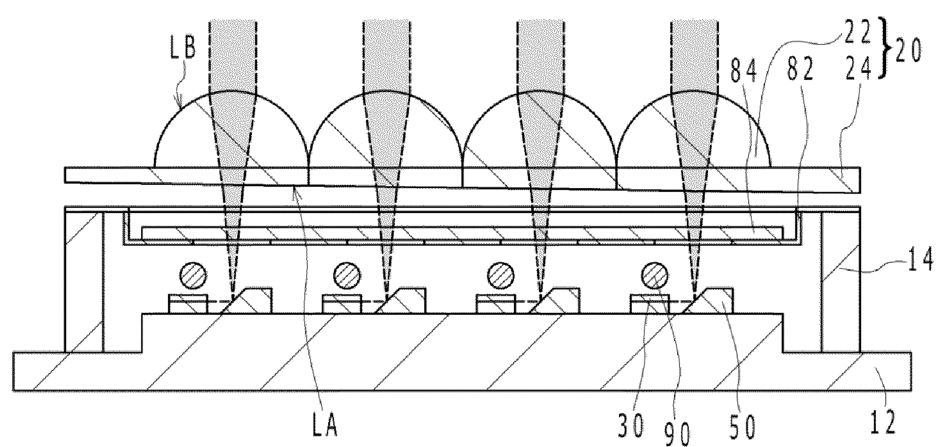
FIG. 5A is a schematic plan view illustrating an example of a step of fixing an optical member to a base body.
Figure 5B:
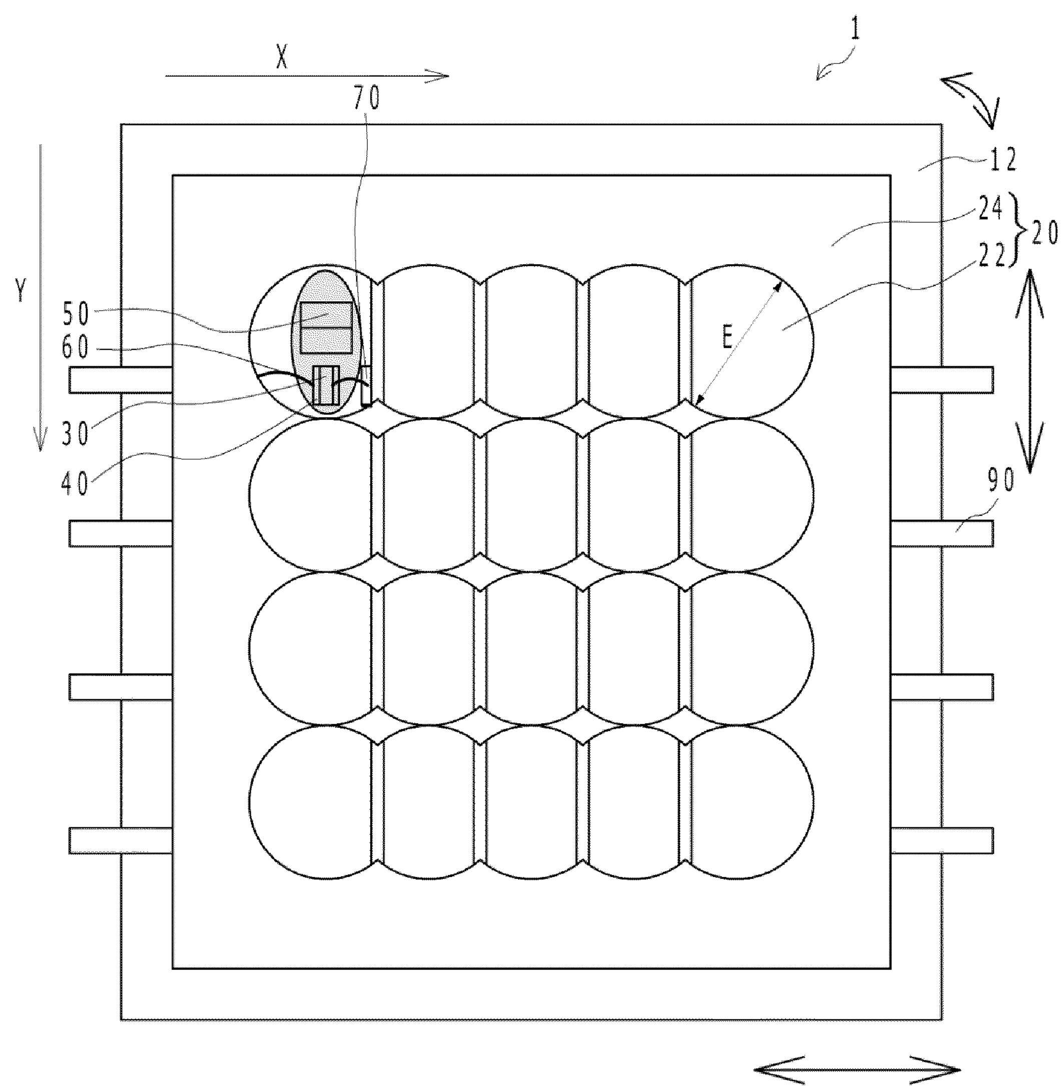
FIG. 5B is a schematic sectional view illustrating an example of a step of fixing an optical member to a base body.
Figure 5C:
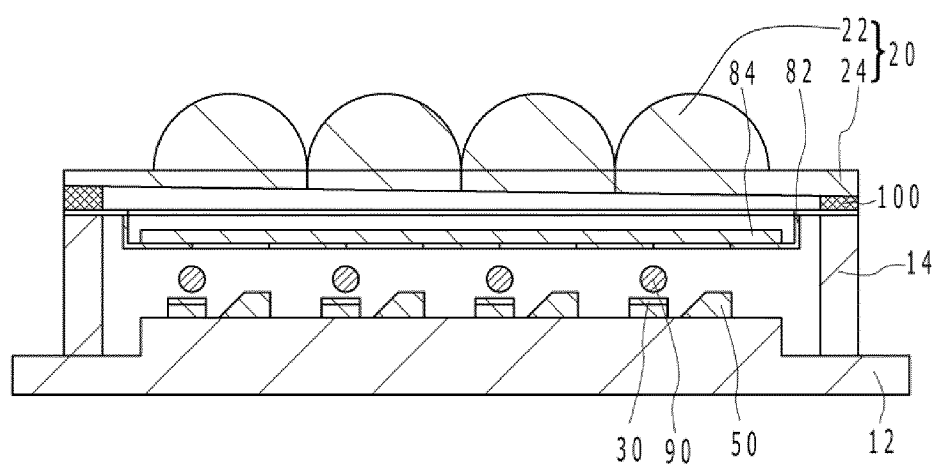
FIG. 5C is a schematic sectional view illustrating an example of a step of fixing an optical member to a base body.

Manufacturing Method of Light-Emitting Device 1 According to First Embodiment A manufacturing method of a light-emitting device 1 according to a first embodiment includes: providing a base body 10 including a base section 12 (refer to FIGS. 2A to 2C); fixing a plurality of semiconductor laser elements 30 on an upper surface of the base section 12 (refer to FIGS. 3A to 3C); and fixing an optical member 20 to the base body 10, the optical member 20 including a plurality of lens sections 22 and a non-lens section 24 disposed in a periphery of the plurality of lens sections 22 in a top view (refer to FIGS. 5A, 5B, and 5C). In addition, in the step of fixing the optical member 20, the optical member 20 is arranged above the base body 10, an adhesive 100 is interposed between the base body 10 and the non-lens section 24 after adjusting an inclination and a height of the optical member 20 and, subsequently, the adhesive 100 is cured to fix the optical member 20 to the base body 10. The light-emitting device 1 obtained in this manner is shown in FIGS. 1A to 1D. According to the present embodiment, because the inclination and the height of the optical member 20 are adjusted, a variance in a divergence angle of light emitted from each lens section 22 in a single light-emitting device can be reduced. In addition, when mass-producing the light-emitting device 1, a variance in a divergence angle of light among the mass-produced light-emitting devices is less likely to occur. Hereinafter, these points will be described in detail.

Generally, an optical member is used in which a light incident-side (i.e., a lower surface side) is flat. When fabricating such an optical member, a thickness of the optical member is adjusted by for example polishing the optical member from the lower surface side. In this case, the optical member may become thicker from one end towards another end due to dimensional tolerance and, consequently, a divergence angle of light may differ between a thick portion and a thin portion. However, in the present embodiment, the inclination and the height of the optical member 20 are adjusted so that the divergence angle of light emitted from the lens section 22 is kept within a predetermined range. Therefore, even when there are dimensional variances of the optical member 20 within a permissible range of dimensional tolerance, a variance of the divergence angle of light emitted from each lens section 22 within a single light-emitting device 1 can be reduced. In addition, because the inclination and the height of the optical member 20 are adjusted for each light-emitting device 1, a variance in a divergence angle of light of an entire light-emitting device among mass-produced light-emitting devices can be suppressed. Hereinafter, a manufacturing method of the light-emitting device 1 will be described in detail.

Providing Base Body 10

Figure 2A:
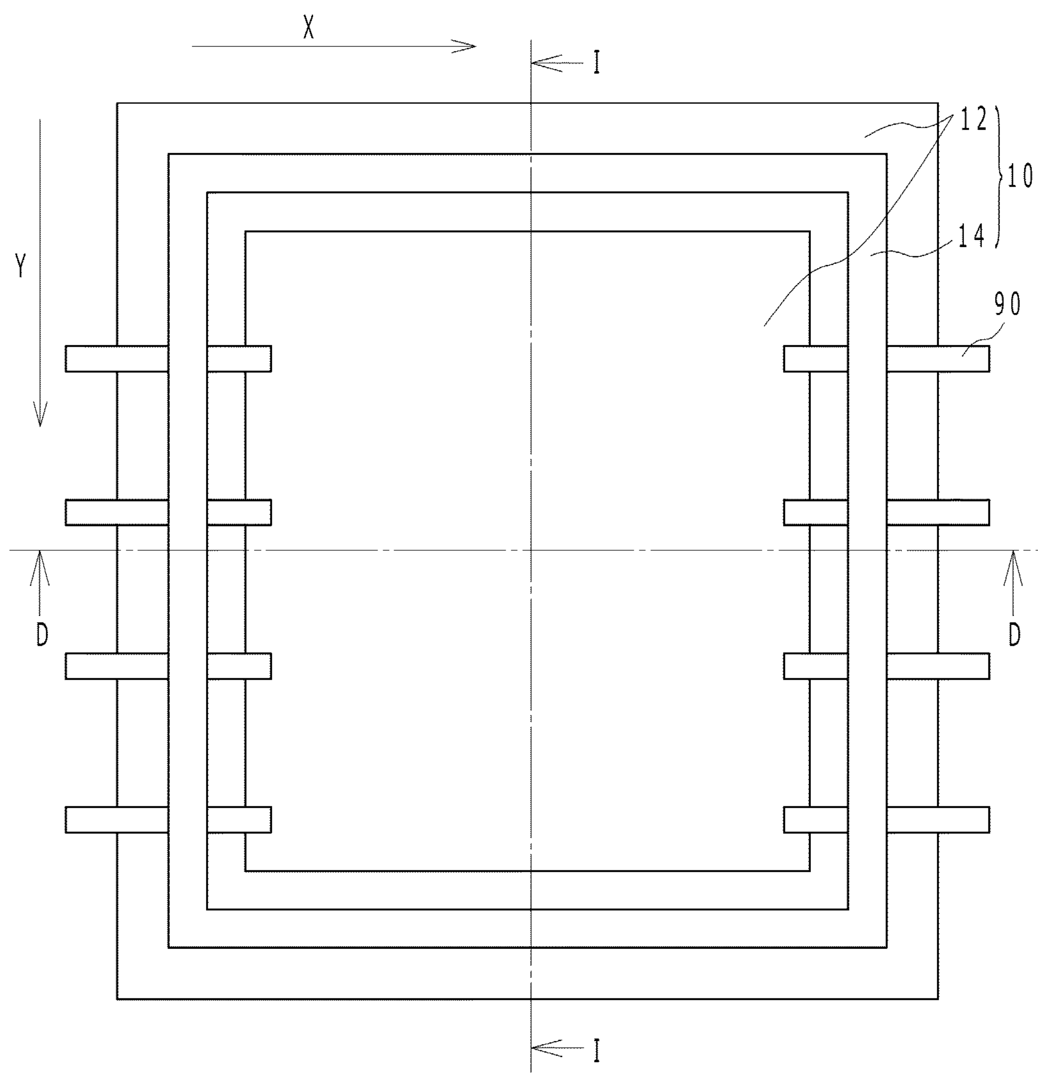
FIG. 2A is a schematic plan view illustrating an example of a step of providing a base body.
Figure 2B:
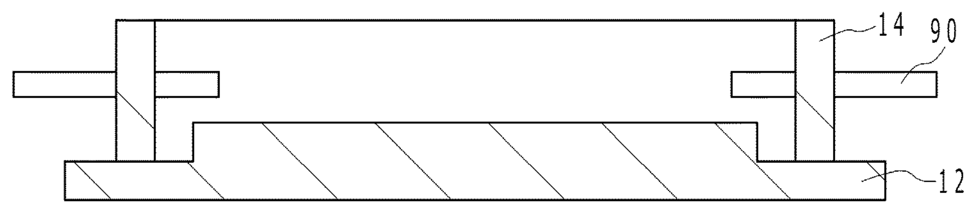
FIG. 2B is a sectional view taken along D-D in FIG. 2A.
Figure 2C:
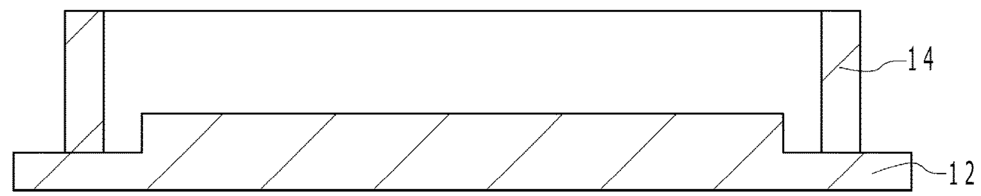
FIG. 2C is a sectional view taken along I-I in FIG. 2A.

First, as shown in FIGS. 2A to 2C, the base body 10 including the base section 12 is provided. In the present embodiment, as the base body 10, a base body including a wall section 14 surrounding one region of an upper surface of the base section 12 is used. The wall section 14 is provided with a hole penetrating an inner side and an outer side of the wall section 14. A lead as wiring 90 for supplying a current to the semiconductor laser elements 30 is inserted into the hole. An insulating section is interposed between the wiring 90 and the wall section 14 inside the hole to insulate the wiring 90 and the wall section 14 from each other. For example, a metal material such as iron, an iron alloy, copper, and a copper alloy, a ceramic material such as $Al_2O_3$, AlN, SiC, and SiN, or a material combining these materials can be used as the base body 10. In this case, copper or a copper alloy is preferably used as the base section 12 due to high heat dissipation and iron or an iron alloy is preferably used for the wall section 14 due to weldability to a lid body 80 to be described later.

Fixing Semiconductor Laser Elements 30

Figure 3A:
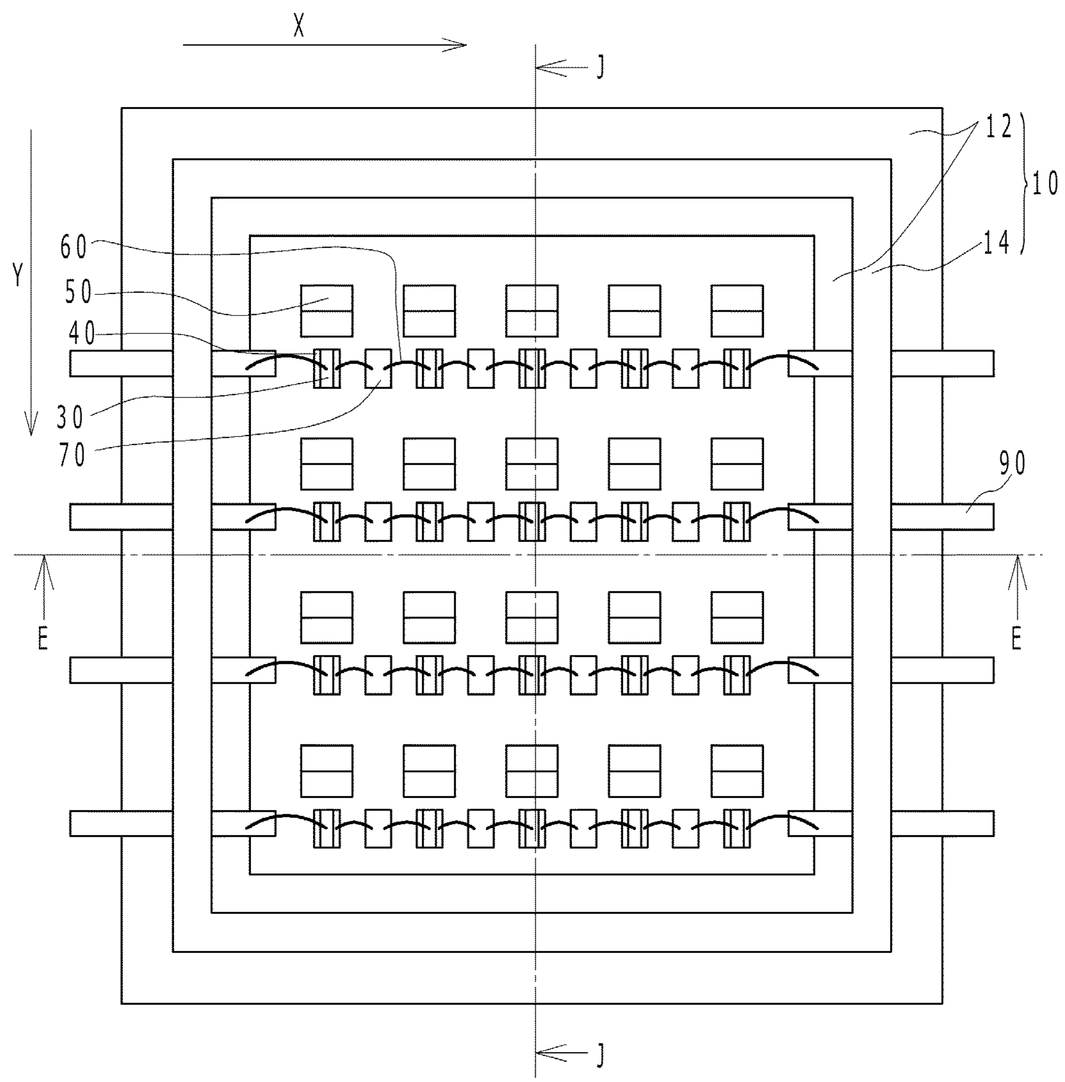
FIG. 3A is a schematic plan view illustrating an example of a step of fixing a semiconductor laser element.
Figure 3B:
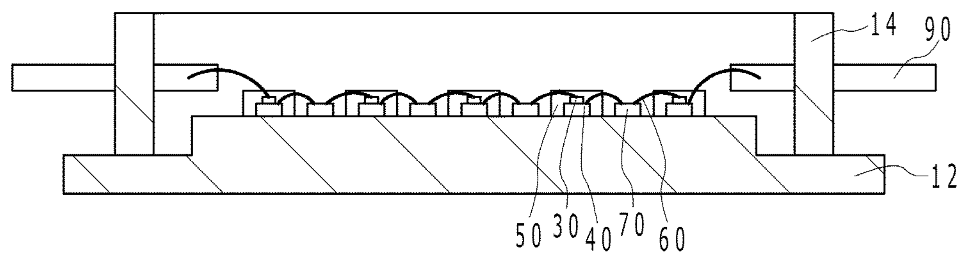
FIG. 3B is a sectional view taken along E-E in FIG. 3A.
Figure 3C:
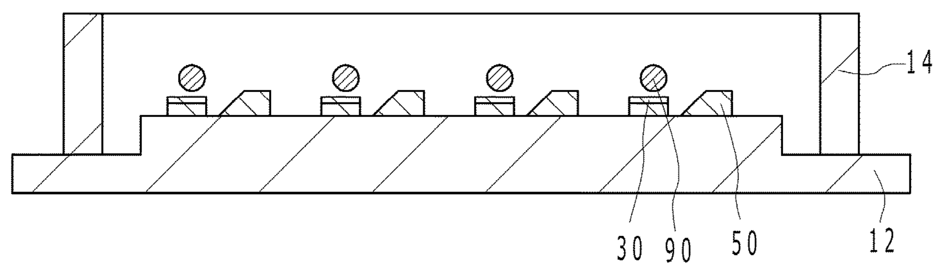
FIG. 3C is a sectional view taken along J-J in FIG. 3A.

Subsequently, as shown in FIGS. 3A to 3C, the plurality of semiconductor laser elements 30 are fixed on the upper surface of the base section 12. In the present embodiment, by interposing a mounting body 40 between the base section 12 and the semiconductor laser element 30, the semiconductor laser elements 30 are indirectly fixed on the upper surface of the base section 12. The plurality of semiconductor laser elements 30 are edge-emitting lasers that each emit a laser beam in a lateral direction (i.e., a direction parallel to the upper surface of the base section 12). In the present embodiment, because the use of the mounting body 40 enables an emitting surface of the semiconductor laser element 30 to be separated from the upper surface of the base section 12, a laser beam can be prevented from striking the upper surface of the base section 12. Instead of interposing the mounting body, the semiconductor laser elements may be directly fixed on the upper surface of the base section.

A laser beam emitted from each semiconductor laser element 30 is reflected by each light-reflecting member 50 and is then incident to a light incident surface LA of each lens section 22. While the laser beam emitted from a single semiconductor laser element 30 may be configured to be incident to a single lens section 22 as in the present embodiment, for example, laser beams emitted from two or more semiconductor laser elements may be collected to be incident to a single lens section.

In the present embodiment, when an X direction in FIG. 3A is assumed to be a row direction and a Y direction in FIG. 3A is assumed to be a column direction, the plurality of semiconductor laser elements 30 are arranged in a 4-row, 5-column matrix pattern. While a 4-row, 5-column matrix pattern is adopted in the present embodiment, when arranging the plurality of semiconductor laser elements 30 in a matrix pattern, the numbers of rows and columns may be arbitrarily set (to m-number of rows×n-number of columns (where $m \geq 2$ and $n \geq 2$)).

As described above, in the present embodiment, the plurality of semiconductor laser elements 30 are disposed in a matrix pattern. In the present embodiment, adjacent semiconductor laser elements 30 disposed in the row direction can be connected in series using a wire 60 and a relay member 70. Because the use of the relay member 70 enables a length of a single wire 60 to be shortened, an increase in electrical resistivity can be discouraged. As the wire 60, gold, silver, copper, aluminum, or the like can be used. As the relay member 70, a metal material such as iron, an iron alloy, and copper or an insulating material such as $Al_2O_3$, AlN, SiC, and SiN having electric wiring formed on an upper surface thereof can be used.

The light-reflecting member 50 can be further fixed on the upper surface of the base section 12 as in the present embodiment (refer to FIGS. 3A to 3C). In this case, the light-reflecting member 50 is a member that reflects light emitted from a single semiconductor laser element 30 among the plurality of semiconductor laser elements 30 toward a single lens section 22 among the plurality of lens sections 22. Arranging the light-reflecting member 50 increases an optical path length (a distance of light emitted from the semiconductor laser element 30 traveling from the emitting surface of the semiconductor laser element 30 until reaching a light-exiting surface LB of the lens section 22: hereinafter, the same description will apply) as compared to a case where the semiconductor laser element 30 is fixed vertically to upper surface of the base section and the optical member 20 is directly irradiated with light from the semiconductor laser element 30. When the optical path length increases, even when the semiconductor laser element 30 deviates from a predetermined position due to mounting accuracy, a direction of an optical axis of light emitted from each lens section 22 can be more readily kept within a predetermined range. Therefore, in the present embodiment, while keeping a divergence angle of light of the optical member 20 as a whole (in other words, a divergence angle of light as the light-emitting device 1) within a predetermined range by adjusting an inclination and a height of the optical member 20, the optical path length is increased by arranging the light-reflecting member 50 to reduce a deviation of an optical axis of light emitted from each lens section 22 to some extent.

When simply arranging a plurality of lens sections in a single row in a top view and causing light to be incident to the plurality of lens sections, a single light-reflecting member extending in the row direction can be arranged below the plurality of lens sections arranged in a single row. However, in the present embodiment, the plurality of light-reflecting members 50 are arranged so that each of the light-reflecting members 50 correspond to the plurality of lens section 22 arranged in a single row. Accordingly, even when a deviation occurs in a position of a single light-reflecting member 50 among the plurality of light-reflecting members 50 arranged in a single row, a positional deviation does not occur on other light-reflecting members 50 in the same row does not occur. Therefore, the optical axis of light emitted from the plurality of lens sections 22 arranged in a single row is less likely to deviate as a whole.

The plurality of light-reflecting members 50 may be fixed to the base body 10 after fixing the plurality of semiconductor laser elements 30 to the base body 10 as in the present embodiment. Otherwise, the plurality of light-reflecting members 50 may be, for example, fixed to the base body 10 before fixing the plurality of semiconductor laser elements 30 to the base body 10. Alternatively, for example, in the step of fixing the plurality of semiconductor laser elements, the semiconductor laser elements 30 and the light-reflecting members 50 may be alternately fixed one after another.

The light-reflecting member 50 has a reflecting surface that reflects light emitted from the semiconductor laser element 30. As the light-reflecting member 50, for example, glass, sapphire, metal, or ceramics on which a light-reflecting film is formed, or metal having a reflecting surface subjected to mirror finishing can be used. As the light-reflecting film, for example, a dielectric multilayer film or a metallic film can be used.

While the light-reflecting members 50 are provided as described above in the present embodiment, light emitted from the semiconductor laser elements may be directed upward without providing the light-reflecting members.

Fixing Lid Body 80

Figure 4A:
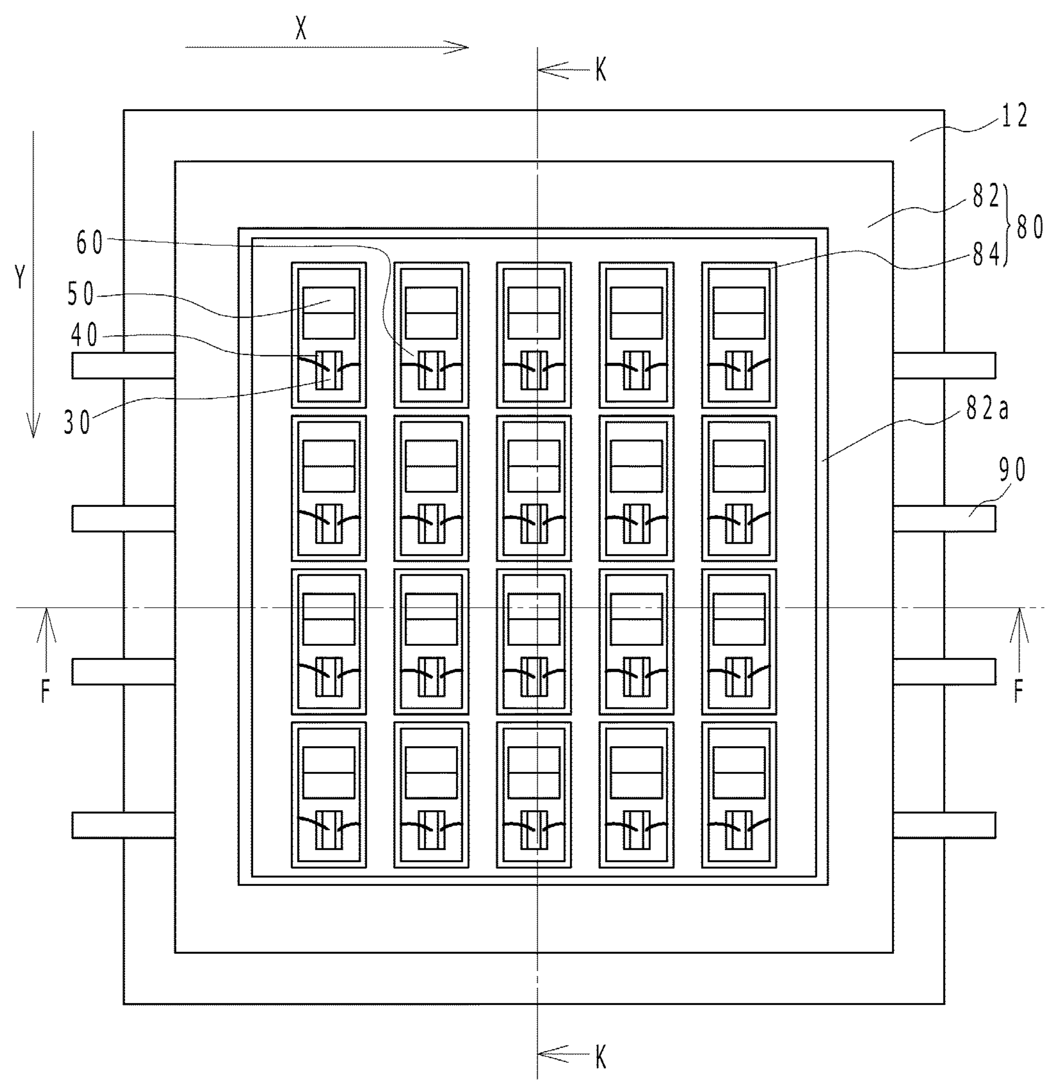
FIG. 4A is a schematic plan view illustrating an example of a step of fixing a lid body to a base body.
Figure 4B:
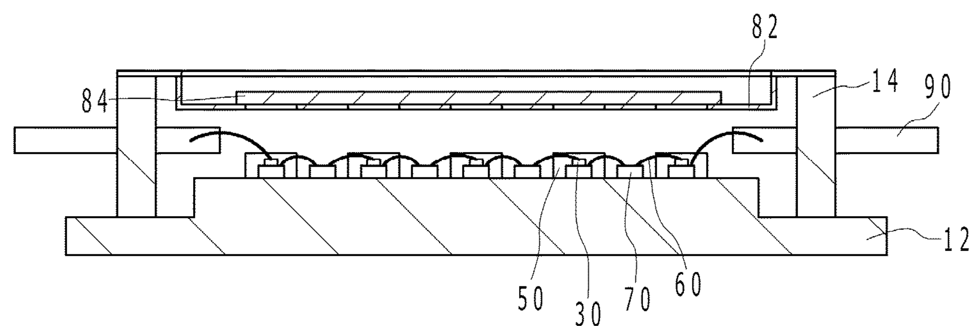
FIG. 4B is a sectional view taken along F-F in FIG. 4A.
Figure 4C:
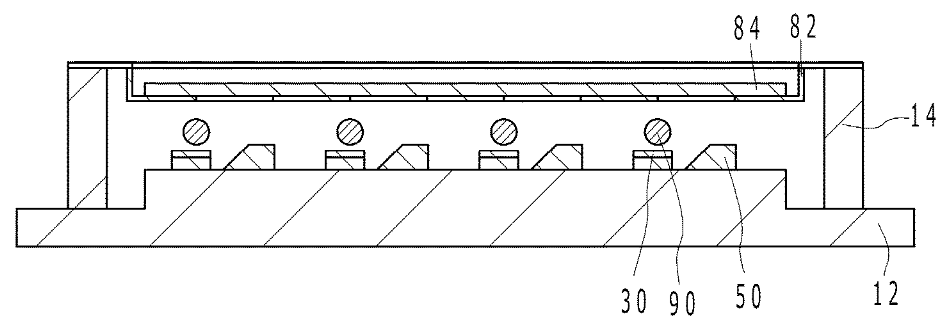
FIG. 4C is a sectional view taken along K-K in FIG. 4A.

Subsequently, as shown in FIGS. 4A to 4C, the lid body 80 is fixed to the base body 10. The lid body 80 includes a light-transmissive section 84 that transmits light emitted from the semiconductor laser elements 30. Use of the lid body 80 enables a space in which the semiconductor laser elements 30 are arranged to be placed in a sealed state. Therefore, in particular, when using a nitride semiconductor as the semiconductor laser elements 30, organic matter as dust is not likely to attracted on the light-exiting surfaces of the semiconductor laser elements 30. The present step is omitted when the light-emitting device 1 does not have the lid body 80.

As the lid body 80, a lid body is used that includes a frame section 82 provided with a plurality of through-holes 82*a* and a plurality of light-transmissive sections 84 that block the respective through-holes 82*a*. A laser beam emitted from a single semiconductor laser element 30 passes through a single through-hole 82*a*. A peripheral section of the frame section 82 is fixed on an upper surface of the wall section 14. In the present embodiment, as shown in FIG. 4B and or other figures, the frame section 82 includes a recess 82*b* that is recessed toward the base section 12. Accordingly, because stress generated on the lid body 80 (i.e., stress generated due to a difference in thermal expansion coefficients between the lid body 80 and the base body 10) is more readily absorbed by a portion extending in a vertical direction of the lid body 80 (i.e., a portion corresponding to an inner wall of the recess 82*b*), damage to the lid body 80 and, particularly, damage to the light-transmissive sections 84 can be reduced.

Unlike in the present embodiment, a lid body can employ a structure including a frame section in which a plurality of through-holes are formed, and a single light-transmissive section that blocks the plurality of through-holes. Alternatively, a lid body can be employ a structure including a frame section provided with a single relatively-large through-hole so as to allow transmission of a plurality of laser beams emitted from a plurality of semiconductor laser elements and a single light-transmissive section that blocks the through-hole.

The lid body 80 may be fixed to the base body 10 by seam welding as in the present embodiment or fixed to the base body 10 using a resin-based adhesive. Seam welding enables the space in which the semiconductor laser elements 30 are arranged (i.e., a space formed by the base body 10 and the lid body 80) to be hermetically sealed to discourage dust accumulation.

The present embodiment includes providing the base body 10, fixing the plurality of semiconductor laser elements 30 on the upper surface of the base section 12, and fixing the lid body 80 on the upper surface of the wall section 14, in this sequence. Instead, a component similar to that produced through the respective steps may be provided. In other words, before fixing the optical member 20 to be described later, a light source unit may be provided that includes: the base body 10 having the base section 12 and the wall section 14 surrounding one region of an upper surface of the base section 12; a plurality of semiconductor laser elements 30 fixed on the upper surface of the base section 12 inside the wall section 14; and the lid body 80 that includes the light-transmissive section 84 for transmitting light emitted from the semiconductor laser elements 30 and that is fixed on an upper surface of the wall section 14.

Fixing Optical Member 20

Subsequently, as shown in FIGS. 5A to 5C, the optical member 20 is fixed to the base body 10. The optical member 20 includes the plurality of lens sections 22 and the non-lens section 24 disposed in a periphery of the plurality of lens sections 22 in a top view. In the present embodiment, the optical member 20 is fixed to the base body 10 via the lid body 80 by fixing the optical member 20 to the lid body 80 fixed to the base body 10. Specifically, the optical member 20 is arranged above the base body 10, the adhesive 100 is interposed between the base body 10 and the non-lens section 24 as shown in FIG. 5C after adjusting an inclination and a height of the optical member 20 as shown in FIGS. 5A and 5B and, subsequently, the adhesive 100 is cured to fix the optical member 20 to the base body 10 via the lid body 80. By adjusting the inclination and the height of the optical member 20 in a state where the adhesive 100 is not interposed, an adverse effect to optical characteristics when the adhesive 100 overruns inward during adjustment can be reduced.

As described above, the lid body 80 can be fixed to the base body 10 by seam welding, joining with a resin-based adhesive, or the like. However, in any case, even though the optical member is simply fixed to the base body via the lid body, a divergence angle of light emitted from each lens section of a single light-emitting device may not be kept within a predetermined range. There is a possibility that, in each of mass-produced light-emitting devices, a divergence angle of light as a light-emitting device cannot be kept within a predetermined range. For example, when fixing the lid body to the base body by seam welding, because the lid body is welded to the base body while pressing the lid body with a roller, there is a possibility that a thickness of a portion in contact with the roller in the upper surface of the lid body, thereby possibly reducing the thickness and possibly losing flatness of the upper surface of the lid body When fixing the lid body to the base body using a resin-based adhesive, not only there is a possibility of dust accumulation due to the generation of organic matter from the adhesive, but there is also a possibility that the lid body may end up being fixed in an inclined state due to uneven thickness of the adhesive or an overrun of the adhesive. However, by adjusting the inclination and the height of the optical member 20 for each light-emitting device 1 as in the present embodiment, even when the upper surface of the lid body 80 is not flat or when the lid body 80 is fixed in an inclined state, a divergence angle of light emitted from each lens section of a single light-emitting device can be kept within a predetermined range. In addition, in each of mass-produced light-emitting devices 1, a divergence angle of light as the light-emitting device 1 can be kept within a predetermined range.

Generally, other members than the optical member 20 such as the light-reflecting members 50 also have dimensional variances. When mounting the light-reflecting members 50 or other member, an actual mounting position may vary due to mounting accuracy. In other words, it is difficult to make a direction of an optical axis of light emitted from each lens section completely consistent among light-emitting devices manufactured by mass production. In consideration thereof, in the present embodiment, a planar position of the optical member 20 is adjusted as well as adjusting the inclination and the height of the optical member 20 as shown in FIG. 5B. Accordingly, when collectively viewing the light emitted from the respective lens sections, not only the divergence angle of light as a light-emitting device but the direction of the optical axis as the light-emitting device can also be kept within a predetermined range. Therefore, according to the present embodiment, in addition to a variance in the divergence angle of light within a single light-emitting device and a variance in the divergence angle of light among mass-produced light-emitting devices, a variance in the direction of the optical axis among mass-produced light-emitting devices can be reduced. In this case, an adjustment of the planar position of the optical member 20 refers to adjusting a position in a vertical direction, a horizontal direction, and a rotational direction in FIG. 5B of the optical member 20 on a plane that is parallel to the upper surface of the base section 12. Hereinafter, the inclination, the height, and the planar position of the optical member 20 may sometimes be simply referred to as the "inclination and the like".

Hereinafter, the adjustment of the inclination and the like of the optical member 20 according to the present embodiment will be described in detail.

First, while holding the optical member 20 with a suction tool to be described later, the optical member 20 is arranged above the base body 10 so that a laser beam emitted from each semiconductor laser element 30 is transmitted through each lens section 22.

Subsequently, as shown in FIG. 5A, the inclination and the height of the optical member 20 are adjusted (i.e., first adjustment). Specifically, the inclination and the height of the optical member 20 are adjusted so that four lens sections 22 positioned in four corners in a top view are at appropriate heights. More specifically, first, for each of the four lens sections 22 positioned in the four corners in a top view, a height at which light transmitted through the lens section becomes parallel light is measured. In other words, while having the semiconductor laser elements 30 actually perform laser emission, a height at which the light emitted from the lens section becomes parallel light is measured for each of the four lens sections 22. And then, the inclination and the height of the optical member 20 are adjusted so that each of the four lens sections 22 are arranged at or in a vicinity of the measured height. A main factor of a difference in the divergence angle of light of each lens section 22 in a single optical member 20 is that, conceivably, a thickness of the optical member 20 gradually increases from one end toward the other end due to a dimensional tolerance of the optical member 20. Therefore, by setting each of the four lens sections 22 positioned in the four corners in a top view at an appropriate height, appropriate position can be achieved at not only for the four lens sections 22 positioned in the four corners, but also the other lens sections 22 positioned between the four lens sections 22. Alternatively, for example, the adjustment of the inclination and the height of the optical member may be performed so that either all of the lens sections are arranged at appropriate heights or a plurality of lens sections at positions other than the four corners among all lens sections are arranged at appropriate heights. While the first adjustment is performed in the present embodiment so that parallel light or a laser beam in a state approximating parallel light is emitted from the lens section 22, the first adjustment can also be performed so that a laser beam with an arbitrary divergence angle that is not parallel light is emitted instead.

In the present embodiment, the first adjustment is performed using a divergence angle in the Y direction shown in FIG. 5B. Generally, a laser beam emitted from the semiconductor laser elements 30 has an elliptical FFP (far field pattern). In the present embodiment, as shown in FIG. 5B, an FFP on a light incident surface LA of the lens section 22 has an elliptical shape that is wider in the Y direction than in the X direction and, accordingly, the divergence angle of light in the Y direction is larger than the divergence angle of light in the X direction. Therefore, an effect of adjusting the divergence angle of light is more readily obtained by performing the first adjustment using the divergence angle in the Y direction shown in FIG. 5B. By adjusting the Y direction with the large divergence angle of light, the first adjustment can be readily performed. Alternatively, as another embodiment, an adjustment can be performed using the divergence angle of light in the X direction in addition to the divergence angle of light in the Y direction or an adjustment can be performed using only the divergence angle of light in the X direction.

Subsequently, the planar position of the optical member 20 is adjusted (i.e., second adjustment). In the second adjustment, first, for each of the lens sections 22, an angle formed between an optical axis of light emitted from the lens section 22 and a reference axis (hereinafter, referred to as a "deviation angle") is measured. Subsequently, based on a result of the measurement, an average value of deviation angles of laser beams emitted from each of the lens sections 22 is obtained and the planar position of the optical member 20 is adjusted so that the average value comes close to 0. In other words, the planar position of the optical member 20 is adjusted so that the optical axis of light emitted from each of the lens sections 22 comes close to the reference axis as a whole. As the reference axis, while a straight line perpendicular to a lower surface of the base body 10 can typically be assumed, a straight line extending in an arbitrary direction can also be assumed.

While the first adjustment and the second adjustment are performed once in the present embodiment, the first adjustment and the second adjustment may be repetitively performed in order to realize more rigorous adjustment. In addition, instead of performing the second adjustment after the first adjustment, the first adjustment may be performed after the second adjustment.

In the present embodiment, the inclination, the height, and the planar position of the optical member 20 are adjusted as described above and information on the inclination, the height, and the planar position after adjustment is stored in a memory or the like. Subsequently, the optical member 20 is temporarily separated from the base body 10 and, subsequently, the adhesive 100 is applied to the upper surface of the lid body 80. Subsequently, based on the stored information, while restoring the optical member 20 to a predetermined inclination, height, and planar position, the lower surface of the optical member 20 is brought into contact with the adhesive 100 applied to the upper surface of the lid body 80. In this manner, by temporarily separating the optical member 20 from the base body 10 and subsequently applying the adhesive 100 to the upper surface of the lid body 80, the adhesive 100 can be readily arranged on the upper surface of the lid body 80. Alternatively, instead of temporarily separating the optical member 20 from the base body 10, while maintaining a state where the inclination, the height, and the planar position of the optical member 20 is adjusted, the adhesive 100 can be injected between the base body 10 and the non-lens section 24 from outside of the optical member 20 in a top view.

Figure 6A:
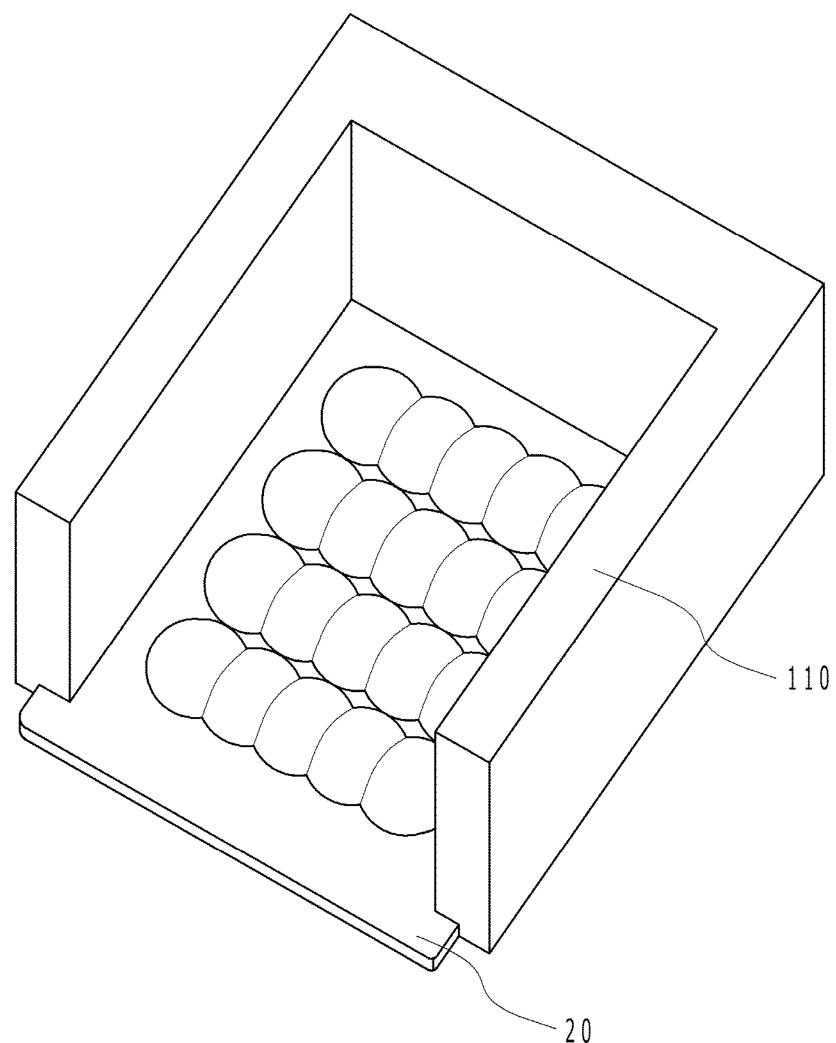
FIG. 6A is a perspective view illustrating an optical member and a suction tool.
Figure 6B:
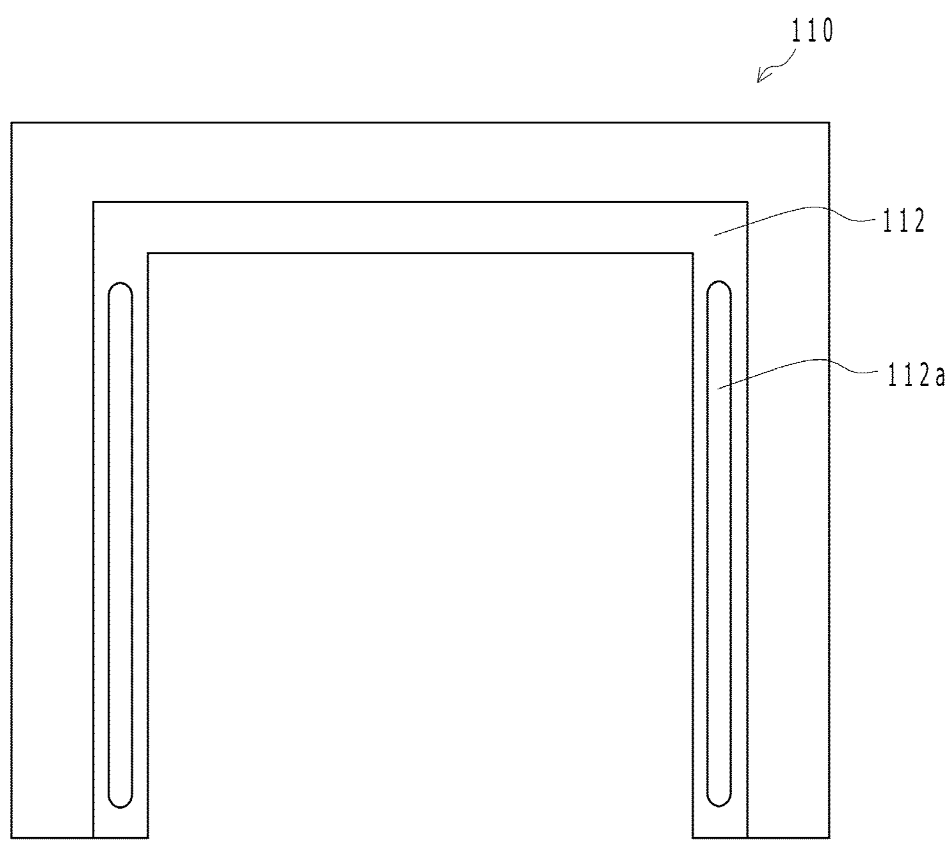
FIG. 6B is a diagram showing a suction tool as seen from a side of a suction surface side.

The adjustment of the inclination, the height, and the planar position of the optical member 20 can be performed using a suction tool 110 such as that shown in FIGS. 6A and 6B. FIG. 6A is a diagram showing a state where the suction tool 110 hold the optical member 20, and FIG. 6B is a diagram showing the suction tool 110 from a suction surface (i.e., a surface side for holding the optical member 20). The suction tool 110 is provided with a depressed section 112 conforming to a shape of an outer periphery of the optical member 20 so as to enable the optical member 20 to be always held at a constant position when the optical member 20 is suctioned. In addition, a part of the depressed section 112 is provided with a through-hole 112*a* for suctioning. While the optical member is to be held by a single suction tool in the present embodiment, for example, two rod-like suction tools can be provided and the optical member 20 can be held by the two suction tools.

The optical member 20 (the lens sections 22 and the non-lens section 24) can be formed using a transmissive material such as glass or synthetic quartz. As shown in FIG. 5A or other figure, each lens section 22 has a light incident surface LA and a light-exiting surface LB, and each laser beam incident to the light incident surface LA of each lens section 22 is emitted from the light-exiting surface LB of each lens section 22.

As the optical member 20, an optical member in which the plurality of lens sections 22 are two-dimensionally arranged in a top view can be used and, typically, an optical member in which the plurality of lens sections 22 are arranged in a matrix pattern in a top view is used. As shown in FIG. 5B and the like, in the present embodiment, in the column direction, a single lens section 22 and the lens section 22 adjacent thereto are connected by a connecting section. When the plurality of lens sections 22 are two-dimensionally arranged, the divergence angle of light emitted from each lens section 22 is more likely to vary and the divergence angle of light is more likely to vary among mass-produced light-emitting devices than in a case where the plurality of lens sections 22 are arranged in a single column. However, according to the present embodiment, because the inclination and the height of the optical member 20 are adjusted, even when the plurality of lens sections 22 are two-dimensionally arranged, a divergence angle of light emitted from each lens section 22 of a single light-emitting device can be kept within a predetermined range. In addition, when mass-producing the light-emitting devices, a divergence angle of light as the light-emitting device 1 can be kept within a predetermined range in each of the mass-produced light-emitting devices.

A photocurable adhesive such as an ultraviolet-curable resin is preferably used as the adhesive 100. Unlike an ordinary adhesive, which is cured over time, a photocurable adhesive enables a timing of curing to be arbitrarily determined by a timing of light irradiation. In addition, a photocurable adhesive is cured in a shorter period of time. Therefore, by using a photocurable adhesive as the adhesive 100, the optical member 20 can be accurately fixed at a predetermined inclination or other condition.

Figure 1A:
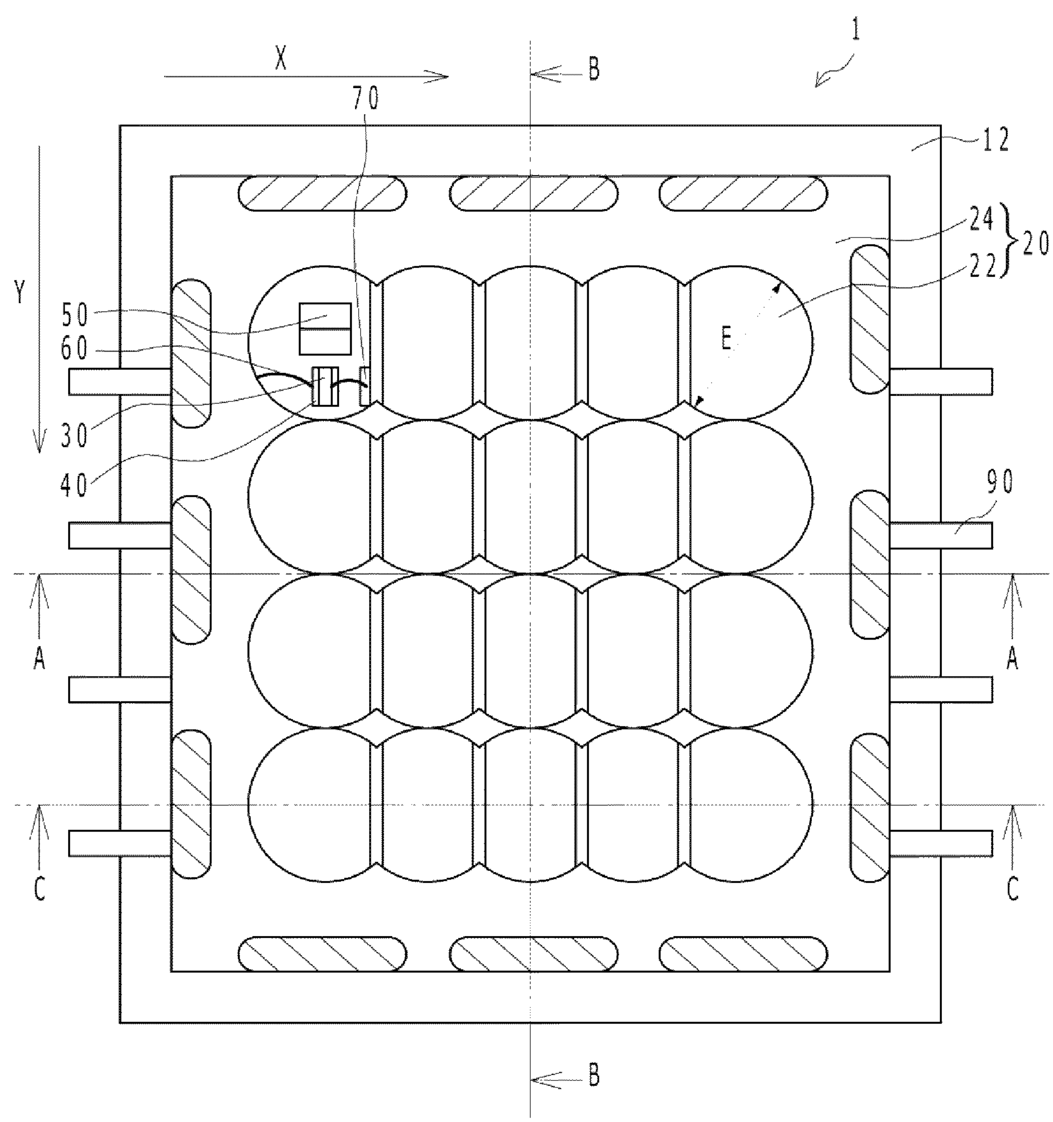
FIG. 1A is a schematic plan view of a light-emitting device according to a first embodiment.
Figure 1B:
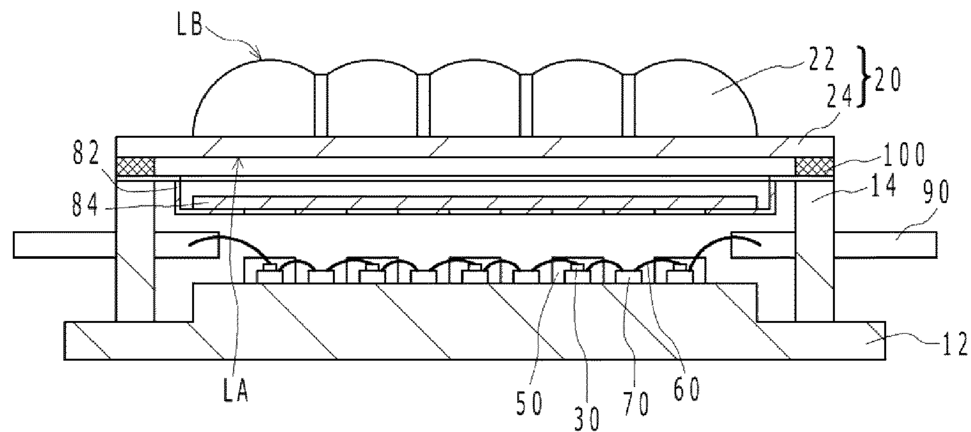
FIG. 1B is a sectional view taken along A-A in FIG. 1A.
Figure 1C:
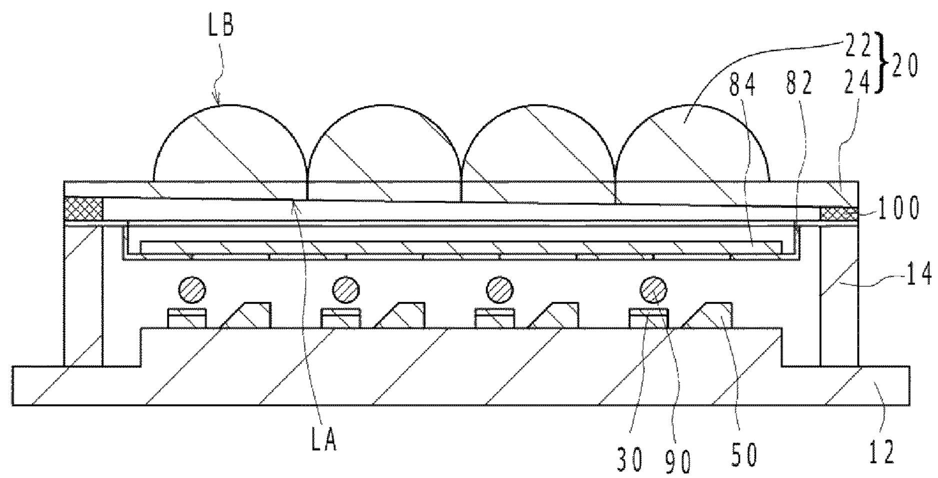
FIG. 1C is a sectional view taken along B-B in FIG. 1A.
Figure 1D:
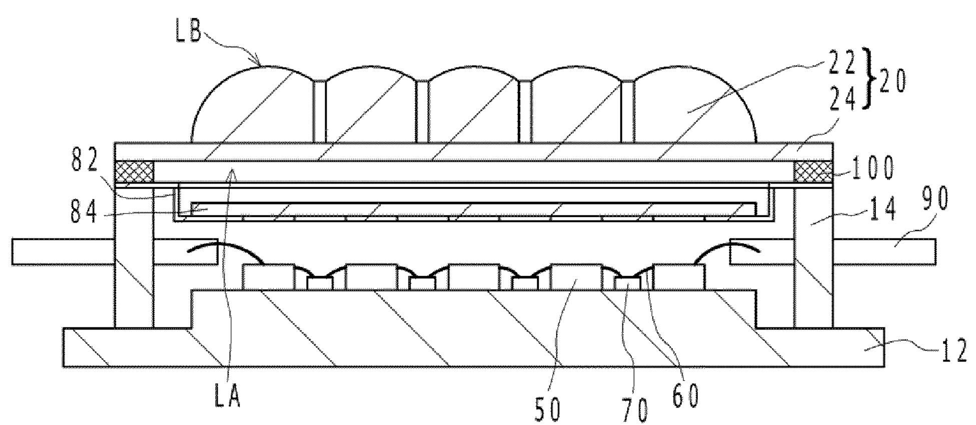
FIG. 1D is a sectional view taken along C-C in FIG. 1A.

In the present embodiment, as shown in FIG. 1A, the adhesive 100 is interposed between the lid body 80 and the optical member 20 in a region excluding a part of an outer peripheral portion of the optical member 20 in a top view. In FIG. 1A, a hatched region indicates the region in which the adhesive 100 is interposed. Because partially providing the adhesive 100 in this manner creates a gap between the adhesives 100, the gap can be utilized to spatially connect the outside of the light-emitting device 1 and the recess 82*b* to each other. When the adhesive contains organic matter, a laser beam may attract dust of the organic matter on the incident surface LA of the lens section. However, by spatially connecting the outside of the light-emitting device 1 and the recess 82*b* to each other as described above, even when the adhesive 100 contains organic matter, organic gas is less likely to accumulate inside the recess 82*b*. Therefore, deposition (or dust accumulation) of organic matter on the lens sections 22 and the light-transmissive section 84 can be reduced. In addition, an occurrence of dew condensation can also be reduced.

Figure 7:
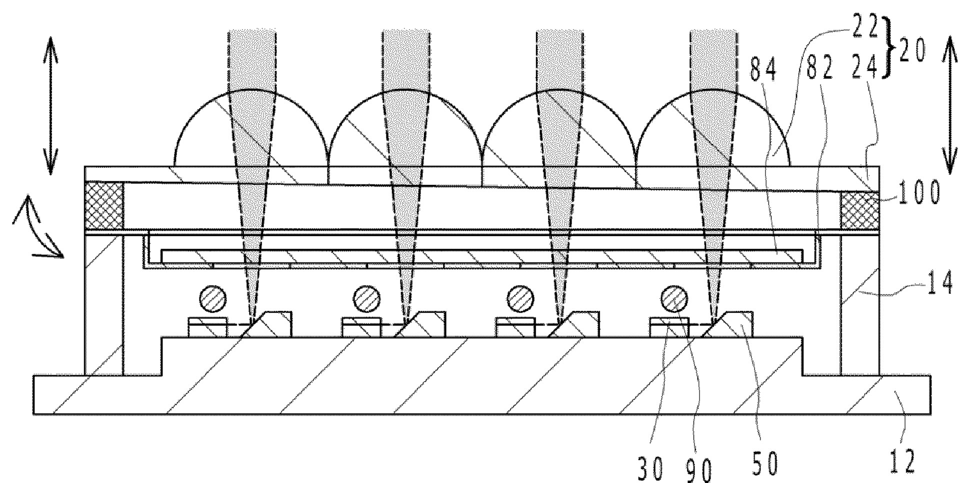
FIG. 7 is a schematic sectional view illustrating another example of a step of fixing an optical member to a base body.

In the step of fixing the optical member 20 to the base body 10, as shown in FIG. 7, the inclination and the height of the optical member 20 may be adjusted in a state where the adhesive 100 is present between the lid body 80 and the optical member 20 and then the adhesive 100 may be cured thereafter. Accordingly, compared to a case where the adhesive is applied without separating the optical member from the base body after adjusting the inclination and the height of the optical member, the adhesive 100 can be more readily arranged on the upper surface of the base body 10 or the upper surface of the lid body 80.

Figure 8:
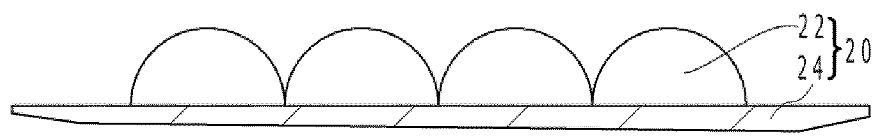
FIG. 8 is a schematic sectional view illustrating an example of an optical member.

An optical member with an inclined surface configured such that the lower surface of the non-lens section 24 approaches the upper surface toward an outer side as shown in FIG. 8 can be used as the optical member 20 and the adhesive 100 can be interposed between the lid body 80 and the inclined surface. Accordingly, when fixing the optical member 20 to the base body 10, the adhesive 100 can be restrained from entering the inside of the wall section 14 (in the present embodiment, the recess 82*b* of the lid body 80). During the adjustment of the height of the optical member, when the optical member is brought closer to the base body in a state where the adhesive is present between the optical member and the lid body, the adhesive is pressed and is likely to enter the inside of the wall section. However, even when the inclination and the like of the optical member are adjusted after the adhesive is interposed in this manner, because the adhesive 100 is more readily pushed outward by using the optical member 20 having the inclined surface, situations where the adhesive 100 enters the inside of the wall section 14 can be reduced.

The optical member 20 may be indirectly fixed to the base body 10 via a member such as the lid body 80 as in the present embodiment or may be directly fixed to the base body 10 without involving a member such as the lid body 80. In addition, the adhesive 100 may be interposed between the base body 10 and the optical member 20 via a member such as the lid body 80 as in the present embodiment or may be interposed between the base body 10 and the optical member 20 without involving a member such as the lid body 80.

Manufacturing Method of Light-Emitting Device 2 According to Second Embodiment A manufacturing method of a light-emitting device 2 is similar to the manufacturing method of the light-emitting device 1 with the exception of matters described below.

Figure 9A:
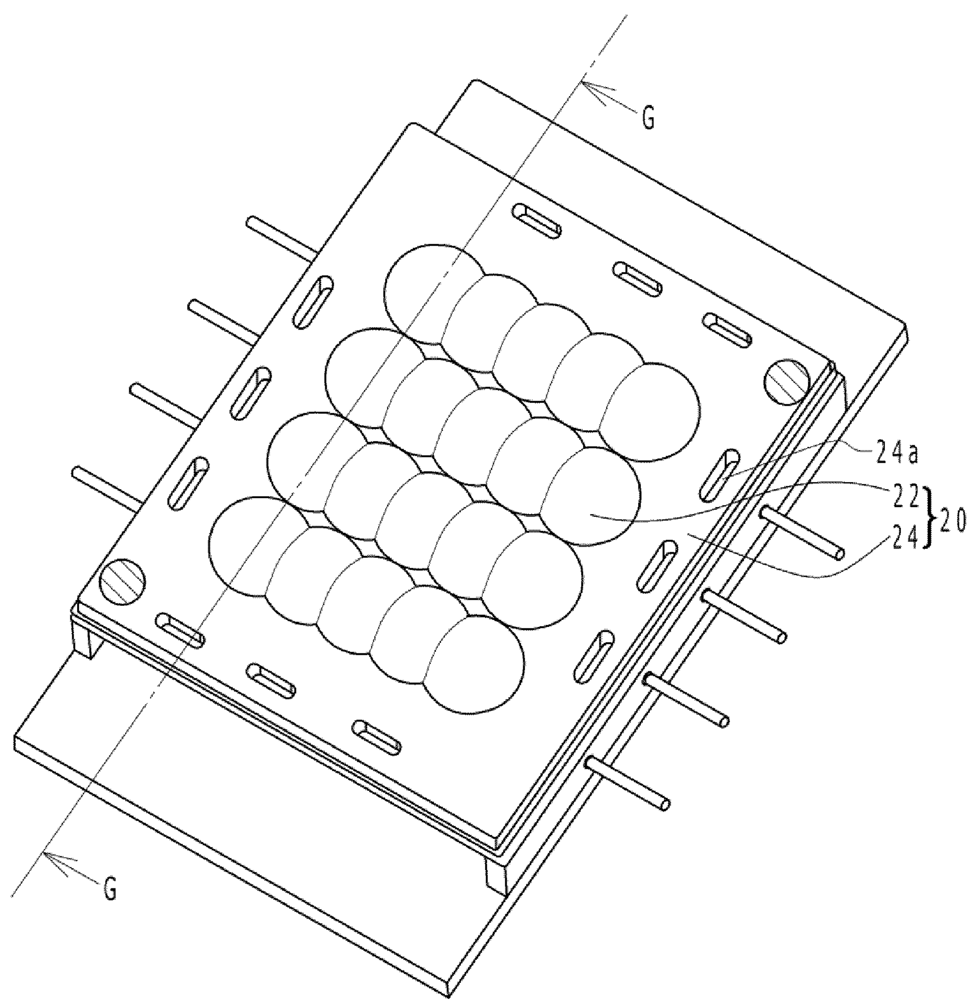
FIG. 9A is a schematic plan view illustrating an optical member according to a second embodiment.
Figure 9B:
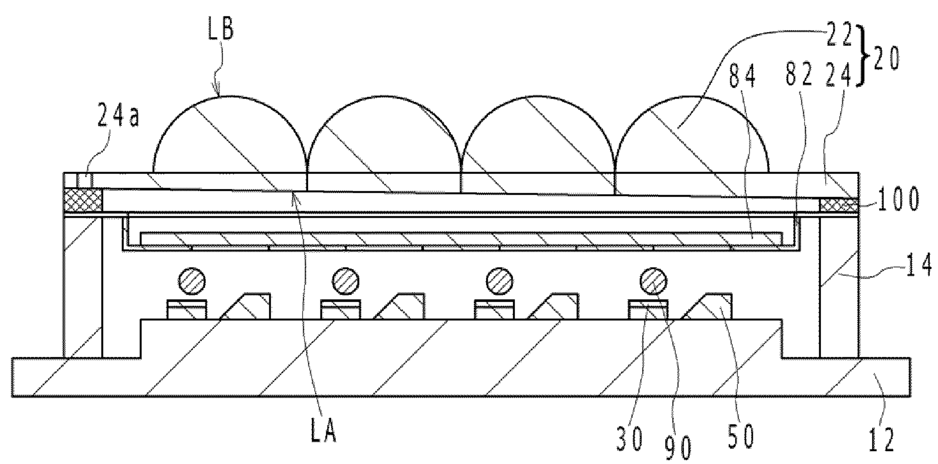
FIG. 9B is a sectional view taken along G-G in FIG. 9A.

As shown in FIGS. 9A and 9B, as the optical member 20, the present embodiment uses an optical member 20 in which a plurality of injection holes 24*a* for injecting the adhesive 100 are provided in the non-lens section 24. By injecting the adhesive 100 from the injection holes 24*a*, the adhesive 100 can be readily interposed between the base body 10 and the non-lens section 24. In addition, adhesion strength can be improved by bringing the adhesive 100 into contact with an inner surface of the injection hole 24*a* as well as the lower surface of the optical member 20.

In the present embodiment, the optical member 20 is temporarily fixed to the base body 10 in a hatched region shown in FIG. 9A after adjusting the inclination and the height of the optical member 20 and before interposing the adhesive 100 between the base body 10 and the optical member 20. The temporary fixing can be performed using, for example, a photocurable adhesive. Because performing the temporary fixing eliminates the need to hold the optical member 20 with the suction tool 110 when interposing the adhesive, the adhesive 100 can be more readily injected from the injection holes 24*a*. The temporary fixing is not an essential step and, by using the suction tool 110 that does not block the injection holes 24*a*, the adhesive 100 may be interposed between the base body 10 and the optical member 20 in a state where the optical member 20 is held by the suction tool 110 without temporarily fixing the optical member 20.

Manufacturing Method of Light-Emitting Device 3 According to Third Embodiment A manufacturing method of a light-emitting device 3 is similar to the manufacturing method of the light-emitting device 1 with the exception of matters described below.

Figure 10A:
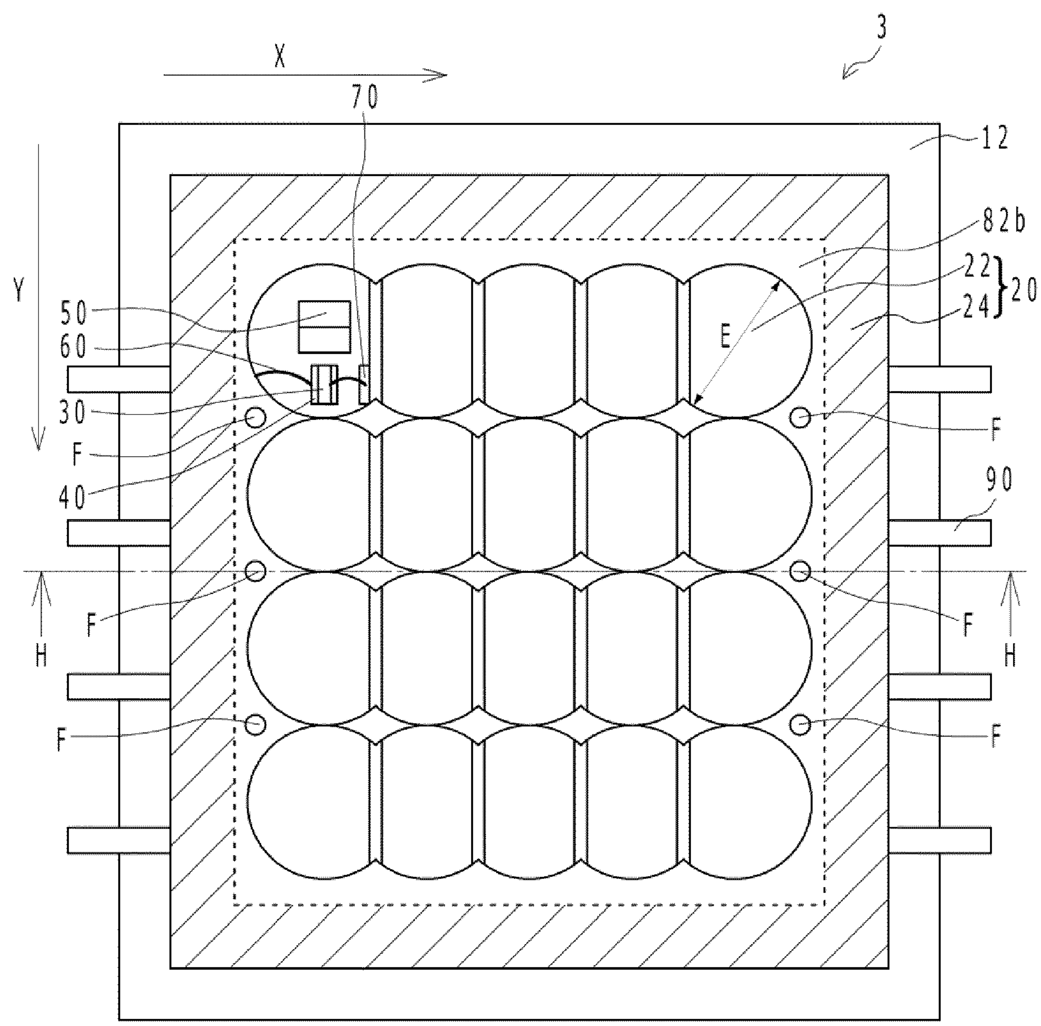
FIG. 10A is a schematic plan view illustrating an optical member according to a third embodiment.
Figure 10B:
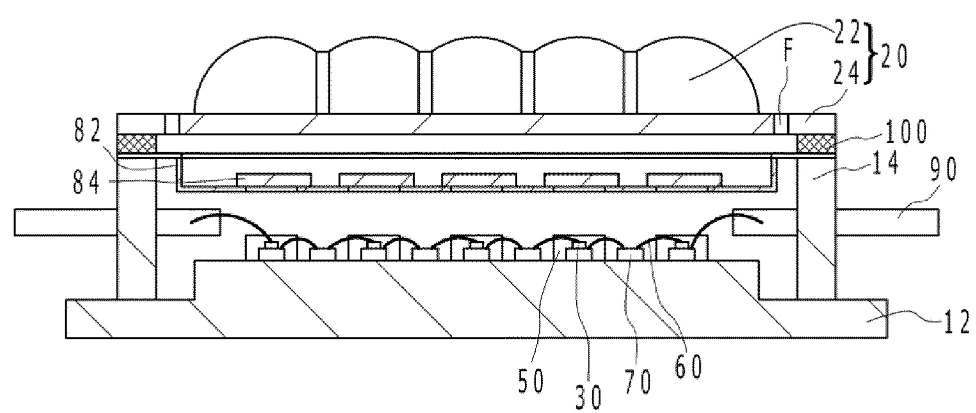
FIG. 10B is a sectional view taken along H-H in FIG. 10A.

As shown in FIGS. 10A and 10B, the light-emitting device 3 uses an optical member 20 in which a through-hole F is provided in the non-lens section 24 as the optical member 20. In this case, the adhesive 100 is interposed between the base body 10 and a region of the non-lens section 24 that is further away from the plurality of lens sections 22 than the through-hole F in a top view. In FIG. 10A, a hatched region indicates the region in which the adhesive 100 is interposed. The adhesive 100 is interposed between the base body 10 and the optical member 20 in a region spanning an entire outer peripheral portion of the optical member 20 in a top view. Even when the adhesive 100 includes organic matter, using the optical member 20 provided with the through-hole F enables organic gas generated by the adhesive 100 to be released to the outside from the through-hole F. Therefore, in a space formed between the optical member 20 and the lid body 80, deposition (or dust accumulation) of organic matter can also be reduced, in addition to enabling dew condensation to be reduced. Furthermore, by interposing the adhesive 100 between the base body 10 and the optical member 20 in a region spanning an entire outer peripheral portion of the optical member 20 in a top view, adhesion strength between the optical member 20 and the base body 10 can be improved. Even in the present embodiment, an optical member provided with the injection holes 24*a* described in the second embodiment can be used.

Manufacturing Method of Light-Emitting Device 4 According to Fourth Embodiment A manufacturing method of a light-emitting device 4 is similar to the manufacturing method of the light-emitting device 1 with the exception of matters described below.

Figure 11:
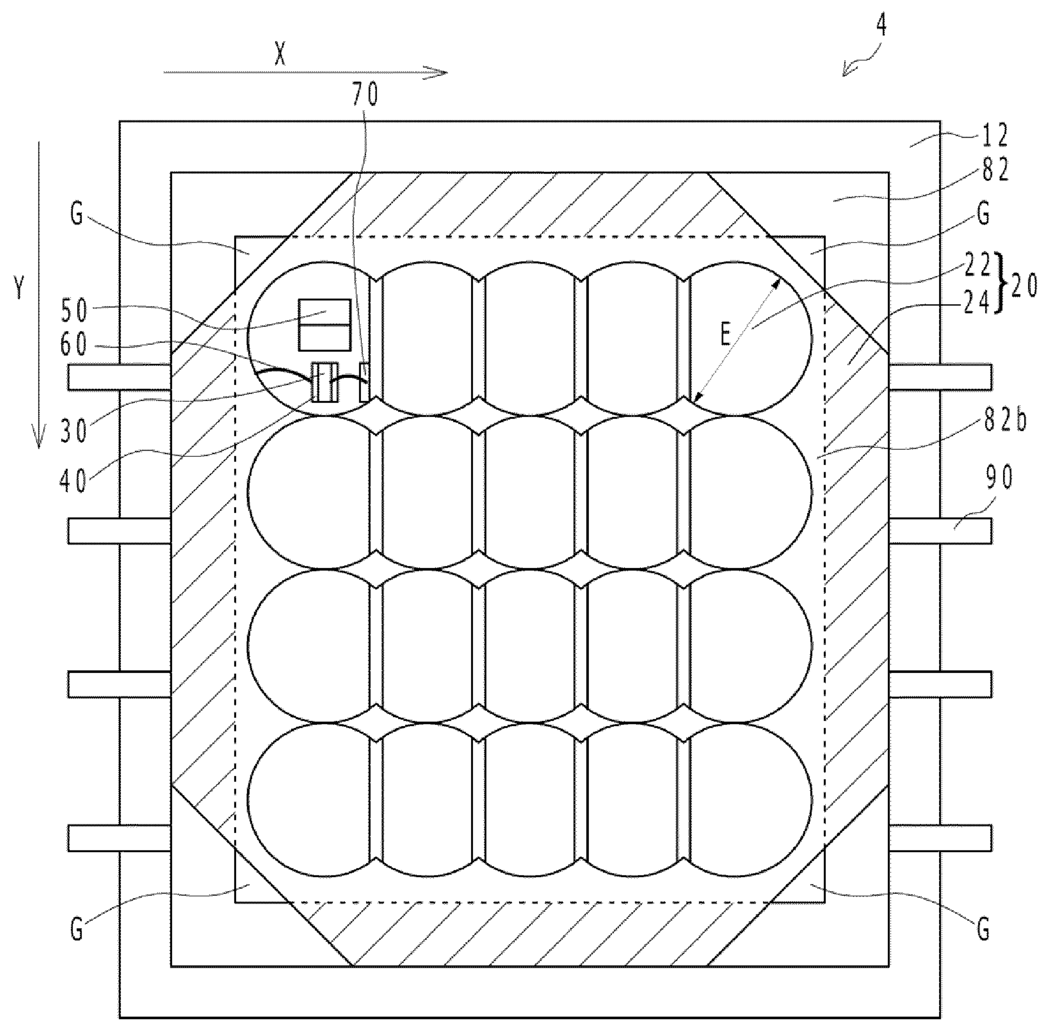
FIG. 11 is a schematic plan view illustrating an optical member according to a fourth embodiment.

In the present embodiment, as shown in FIG. 11, in the step of fixing the optical member 20, the optical member 20 is fixed to the base body 10 via the lid body 80 so that a part of the outer peripheral portion of the optical member 20 is positioned inside the recess 82*b* in a top view. In other words, the optical member 20 used in the present embodiment is shaped such that four corners thereof are cut off in a top view and openings G are formed in the four cut-off shape portions. In FIG. 11, a hatched region indicates the region in which the adhesive 100 is interposed. Using this optical member 20 enables a portion where the optical member 20 and the base body 10 or the lid body 80 are not bonded by the adhesive in a top view to be more reliably formed in comparison to the first embodiment in which the adhesive 100 is partially arranged on the upper surface of the wall section 14. Even in the present embodiment, an optical member provided with the injection holes 24*a* described in the second embodiment can be used.

Example

In the present example, a light-emitting device was manufactured by a manufacturing method corresponding to the fourth embodiment. Hereinafter, the manufacturing method of a light-emitting device according to the present example will be described with reference to FIGS. 2A to 5C and 11.

First, the base body 10 including the base section 12 made of copper and the wall section 14 that is made of an iron alloy and that surrounds one region of an upper surface of the base section 12 was provided (refer to FIGS. 2A to 2C).

Subsequently, the semiconductor laser element 30, which is made of a nitride semiconductor and which has an emission wavelength of 455 nm, was arranged on the upper surface of the base section 12 on the inside of the wall section 14. Subsequently, the light-reflecting member 50, which includes glass and a light-reflecting film made of a dielectric multilayer film formed on the glass, was arranged on the upper surface of the base section 12. This was repetitively performed 20 times, and twenty semiconductor laser elements 30 and twenty light-reflecting members 50 were respectively arranged in four rows and five columns (refer to FIGS. 3A to 3C).

Subsequently, the lid body 80 including the frame section 82 made of an iron alloy and provided with twenty through-holes 82*a* and twenty light-transmissive sections 84 blocking the respective through-holes 82*a* was fixed on the upper surface of the wall section 14 by seam welding (refer to FIGS. 4A to 4C). The lid body 80 includes the recess 82*b* that is recessed toward the base section 12 on the inside of the wall section 14 in a state of being fixed to the wall section 14.

Subsequently, the optical member 20 was arranged above the base body 10 and the inclination, the height, and the planar position of the optical member 20 were adjusted using an autocollimator and various stages. During the adjustment, after covering portions other than at the lens section being measured with a light-shielding plate so that light was emitted only from the lens section being measured, the height of the lens section at which parallel light is obtained and a deviation angle of the optical axis of light emitted from the lens section were measured.

While a description will be given below with reference to FIGS. 5A to 5C, the optical member 20 shown in FIG. 11 was used as the optical member 20. The following description assumes that, in FIG. 11, the lens section 22 in the first row, first column is denoted by lens number 1, the lens section 22 to the right thereof in the first row, second column is denoted by lens number 2, the lens section 22 to the right thereof in the first row, third column is denoted by lens number 3, the lens section 22 to the right thereof in the first row, fourth column is denoted by lens number 4, the lens section 22 to the right thereof in the first row, fifth column is denoted by lens number 5, and so on (in other words, lens numbers 1 to 5 are assigned from a left end toward a right end of a topmost row). In a similar manner, lens numbers 6 to 10 are assigned from the first column toward the fifth column in the second row (i.e., second row from top), lens numbers 11 to 15 are assigned from the first column toward the fifth column in the third row (i.e., third row from top), and lens numbers 16 to 20 are assigned from the first column toward the fifth column in the fourth row (i.e., fourth row from top). The following description assumes that a stage position in the X direction (i.e., a horizontal direction in FIG. 11) is an X stage position, a stage position in the Y direction (a vertical direction in FIG. 11) is a Y stage position, and a stage position in the Z direction (i.e., a direction perpendicular to a paper plane or, in other words, a height direction in FIG. 11) is a Z stage position.

First, in each of the lens sections 22 positioned at the four corners of the optical member 20, the Z stage position when light emitted from the lens section 22 becomes parallel light or close to parallel in the Y direction was measured. Measuring the Z stage position enables a relative height of the lens section 22 when the light emitted from the lens section 22 becomes parallel light to be recognized. As a result of the measurement, the Z stage position when each lens section emits parallel light was 174 μm for lens number 1, 185 μm for lens number 5, 165 μm for lens number 16, and 162 μm for lens number 20.

Subsequently, based on a difference between the Z stage position of lens number 1 and the Z stage position of lens number 5 and a difference between the X stage position upon measurement of a height at which parallel light is obtained with respect to lens number 1 and the X stage position upon measurement of a height at which parallel light is obtained with respect to lens number 5, an inclination to be adjusted in the X direction that is required to obtain parallel light for both lens number 1 and lens number 5 was calculated as an angle A to be −0.045 degrees. In a similar manner, based on a difference between the Z stage position of lens number 16 and the Z stage position of lens number 20 and a difference between the X stage position upon measurement of a height at which parallel light is obtained with respect to lens number 16 and the X stage position upon measurement of a height at which parallel light is obtained with respect to lens number 20, an inclination to be adjusted in the X direction that is required to obtain parallel light for both lens number 16 and lens number 20 was calculated as an angle B to be 0.012 degrees. In a similar manner, based on a difference between the Z stage position of lens number 1 and the Z stage position of lens number 16, and a difference between the Y stage position upon measurement of a height at which parallel light is obtained with respect to lens number 1 and the Y stage position upon measurement of a height at which parallel light is obtained with respect to lens number 16, an inclination to be adjusted in the Y direction that is required to obtain parallel light for both lens number 1 and lens number 16 was calculated as an angle C to be −0.029 degrees. In a similar manner, based on a difference between the Z stage position of lens number 5 and the Z stage position of lens number 20 and a difference between the Y stage position upon measurement of a height at which parallel light is obtained with respect to lens number 5 and the Y stage position upon measurement of a height at which parallel light is obtained with respect to lens number 20, an inclination to be adjusted in the Y direction that is required to obtain parallel light for both lens number 5 and lens number 20 was calculated as an angle D to be −0.073 degrees. In addition, based on an average value (−0.039 degrees) of the two values (the angle A and the angle B) obtained with respect to the X direction and an average value (−0.066 degrees) of the two values (the angle C and the angle D) obtained with respect to the Y direction, the inclination of the optical member 20 was adjusted so that each of the lens sections 22 at the four corners assumed an appropriate height. In this case, a negative value means that an adjustment is required so that a left side in FIG. 11 in the X direction approaches the upper surface of the base section 12 or that an adjustment is required so that a lower side in FIG. 11 in the Y direction approaches the upper surface of the base section 12. On the other hand, a positive value means that an adjustment is required so that a right side in FIG. 11 in the X direction approaches the upper surface of the base section 12 or that an adjustment is required so that an upper side in FIG. 11 in the Y direction approaches the upper surface of the base section 12.

In order to confirm the effect of the adjustment, the Z stage position at which parallel light is obtained was measured after the adjustment for each of lens numbers 1, 5, 16, and 20. As a result, the Z stage position was 225 μm for lens number 1, 228 μm for lens number 5, 227 μm for lens number 16, and 222 μm for lens number 20. In addition, a calculation of the angles A to D after the adjustment in a similar manner to that described above resulted in −0.012 degrees for the angle A, 0.020 degrees for the angle B, 0.006 degrees for the angle C, and −0.019 degrees for the angle D. Furthermore, an average value of the two values (the angle A and the angle B) obtained with respect to the X direction was −0.002 degrees and an average value of the two values (the angle C and the angle D) obtained with respect to the Y direction was −0.004 degrees.

These results are shown in FIGS. 12 and 13. As is apparent from FIGS. 12 and 13, light coming closer to parallel light was obtained at all of the lens sections 22 positioned in the four corners in a top view by adjusting the height and the inclination of the optical member 20. FIG. 12 shows that there are significant differences between the Z stage position where parallel light is obtained for each of the lens numbers 1, 5, 16, and 20 before the adjustment and the Z stage position where parallel light is obtained for each of the lens numbers 1, 5, 16, and 20 after the adjustment. This is because the reference axis for adjusting the inclination of the optical member 20 is not positioned at the center of the optical member 20 but is positioned on the stage for adjusting the inclination of the optical member 20 and the stage is at a position separated from the optical member 20. In other words, although the Z stage position where parallel light is obtained for each of the lens numbers 1, 5, 16, and 20 has changed before and after the adjustment, the actual height of each lens section at which parallel light is obtained for each of the lens numbers 1, 5, 16, and 20 is approximately the same before and after the adjustment.

Subsequently, for all 20 lens sections 22, a deviation angle of an optical axis of a laser beam emitted from the lens section 22 from a reference axis was measured (in this case, a straight line perpendicular to the lower surface of the base section 12 was adopted as the reference axis). And then, the planar position of the optical member 20 was adjusted so that an average value of the results of the measurement approached the reference axis.

Figures 14, 15:
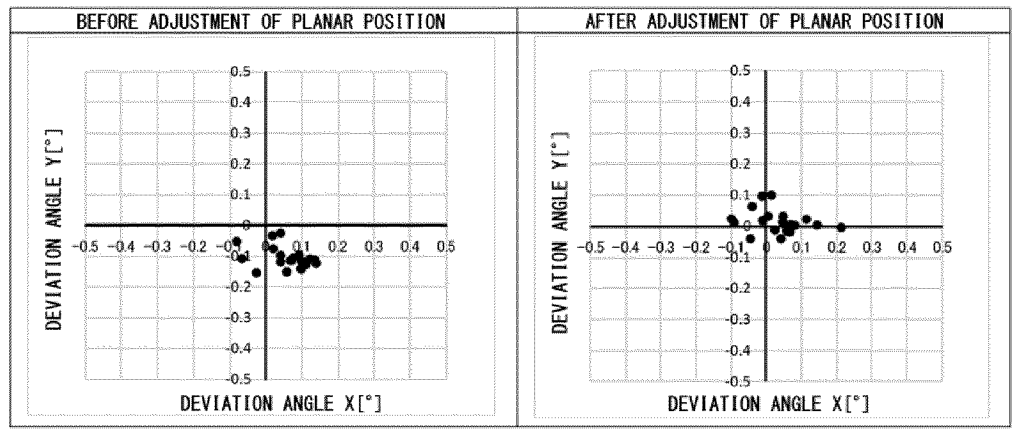
FIG. 14 is a table showing deviation angles of an optical axis of light emitted from lens number 1 and other lens numbers in a practical example.
FIG. 15 is a diagram plotting data in FIG. 14.

FIG. 14 shows deviation angles of the optical axes of laser beams emitted from lens sections 22 before and after the adjustment of the planar position, and FIG. 15 shows the data in FIG. 14 plotted to XY coordinates. In FIG. 14, θx denotes a deviation angle in the X direction in FIG. 11, θy denotes a deviation angle in the Y direction in FIG. 11, and D denotes a deviation angle obtained as a compound angle of θx and θy. As is apparent from FIGS. 14 and 15, an amount of deviation of an optical axis when the light-emitting device is considered a single light source could be reduced by adjusting the planar position of the optical member 20.

While embodiments and an example have been described above, it is to be understood that the present invention is not limited to the embodiments and the example in any way whatsoever.

What is claimed is:

1. A method of manufacturing a light-emitting device, the method comprising:

providing a base body including a base section and a wall section extending upward from the base section;

providing an optical member comprising a plurality of lens sections arranged in a matrix pattern, and a non-lens section disposed at a periphery of the plurality of lens sections in a top view;

fixing a plurality of semiconductor laser elements on an upper surface of the base section; and fixing an optical member above an upper surface of the wall section, such that the optical member is located above the base body, wherein the step of fixing the optical member comprises:

interposing an adhesive between the upper surface of the wall section and a lower surface of the non-lens section of the optical member either before or after adjusting an inclination, a height, and a planar position of the optical member, and subsequently, curing the adhesive such that a height of the adhesive compensates for dimensional variances of the optical member;

wherein, in the step of fixing the optical member, the planar position of the optical member is adjusted by performing steps comprising:

for each of the plurality of lens sections, determining a deviation angle formed between an optical axis of light emitting from the lens section and a reference axis, determining an average value of the determined deviation angles, and adjusting the planar position of the optical member such that the average value of the determined deviation angles is close to 0.

2. The method according to claim 1, wherein:

the wall section surrounds a first region of the upper surface of the base section, in the step of fixing the plurality of semiconductor laser elements, the plurality of semiconductor laser elements are fixed on the upper surface of the base section inside the wall section, the method further comprises, between the step of fixing the semiconductor laser elements and the step of fixing the optical member, fixing a lid body on an upper surface of the wall section, the lid body including one or more light-transmissive sections, the one or more light-transmissive sections being configured to transmit light emitted from at least one of the semiconductor laser elements.

3. The method according to claim 1, wherein the plurality of lens sections of the optical member are two-dimensionally arranged in the top view.

4. The method according to claim 3, wherein the adhesive is a photocurable adhesive.

5. The method according to claim 4, wherein, in the step of fixing the optical member, the adhesive is interposed between the base body and the non-lens section after adjusting the inclination, the height, and the planar position of the optical member.

6. The method according to claim 5, wherein:

the non-lens section of the optical member includes a plurality of injection holes for injecting the adhesive, and in the step of fixing the optical member, the adhesive is interposed between the base body and the non-lens section by injecting the adhesive through the injection holes.

7. The method according to claim 4, wherein:

the non-lens section of the optical member includes a through-hole, the adhesive is an adhesive containing organic matter, and in the step of fixing the optical member, the adhesive is interposed between the base body and a region of the non-lens section that is farther away from the plurality of lens sections than the through-hole in the top view.

8. The method according to claim 7, wherein, in the step of fixing the optical member, the adhesive is interposed between the base body and the non-lens section in a region spanning an entire outer peripheral portion of the optical member in the top view.

9. The method according to claim 4, wherein:

the adhesive is an adhesive containing organic matter, and in the step of fixing the optical member, the adhesive is interposed between the base body and the non-lens section in a region excluding a part of an outer peripheral portion of the optical member in the top view.

10. The method according to claim 9, wherein:

the lid body includes a recess that is recessed toward the base section inside the wall section, and in the step of fixing the optical member, the optical member is fixed to the base body via the lid body such that a part of an outer peripheral portion of the optical member is positioned inside the recess in the top view.

11. The method according to claim 10, further comprising fixing a plurality of light-reflecting members on the upper surface of the base section.

12. The method according to claim 11, wherein each of the light-reflecting members is configured to reflect light emitted from a respective one of the semiconductor laser elements toward a respective one of the plurality of lens sections.

13. The method according to claim 12, wherein, in the step of fixing the lid body, the lid body is fixed on the base body by welding.

14. The method according to claim 4, further comprising fixing a plurality of light-reflecting members on the upper surface of the base section, each of the light-reflecting members being configured to reflect light emitted from a respective one of the semiconductor laser elements toward a respective one of the plurality of lens sections.

15. A method of manufacturing a light-emitting device, the method comprising:

providing a light source unit including:

a base body having a base section and a wall section surrounding a first region of an upper surface of the base section and extending upward from the upper surface of the base section, a plurality of semiconductor laser elements fixed on the upper surface of the base section inside the wall section, and a lid body that includes one or more light-transmissive sections, the one or more light-transmissive sections being configured to transmit light emitted from at least one of the semiconductor laser elements, the lid body being fixed on an upper surface of the wall section;

providing an optical member comprising a plurality of lens sections arranged in a matrix pattern, and a non-lens section disposed at a periphery of the plurality of lens sections in a top view; and fixing an optical member above the upper surface of the wall section, such that the optical member is located above the base body, wherein the step of fixing the optical member comprises:

interposing an adhesive between the upper surface of the wall section and a lower surface of the non-lens section of the optical member either before or after adjusting an inclination, a height, and a planar position of the optical member, and subsequently, curing the adhesive such that a height of the adhesive compensates for dimensional variances of the optical member;

wherein, in the step of fixing the optical member, the planar position of the optical member is adjusted by performing steps comprising:

for each of the plurality of lens sections, determining a deviation angle formed between an optical axis of light emitting from the lens section and a reference axis, determining an average value of the determined deviation angles, and adjusting the planar position of the optical member such that the average value of the determined deviation angles is close to 0.

16. The method according to claim 15, wherein the adhesive is a photocurable adhesive.

17. The method according to claim 16, wherein the plurality of lens sections of the optical member are two-dimensionally arranged in the top view.

18. The method according to claim 17, further comprising fixing a plurality of light-reflecting members on the upper surface of the base, each of the light-reflecting members being configured to reflect light emitted from a respective one of the semiconductor laser elements toward a respective one of the plurality of lens sections.

19. The method according to claim 1, wherein:

the plurality of lens sections of the optical member are arranged in a matrix pattern, and in the step of fixing the optical member, the height of the optical member is adjusted based on a height of only corner lens sections among the plurality of lens section.

20. The method according to claim 19, wherein, in the step of fixing the optical member, the height of the optical member is adjusted by:

for each of the corner lens sections, determining a height at which light transmitted through the corner lens section becomes parallel, and adjusting the height of each of the corner lens sections such that each of the corner lens sections is located at the determined height.

21. The method according to claim 15, wherein:

the plurality of lens sections of the optical member are arranged in a matrix pattern, and in the step of fixing the optical member, the height of the optical member is adjusted based on a height of only corner lens sections among the plurality of lens section.

22. The method according to claim 21, wherein, in the step of fixing the optical member, the height of the optical member is adjusted by:

for each of the corner lens sections, determining a height at which light transmitted through the corner lens section becomes parallel, and adjusting the height of each of the corner lens sections such that each of the corner lens sections is located at the determined height.

* * * * *